United States Patent
Ryu et al.

(10) Patent No.: US 6,956,238 B2
(45) Date of Patent: Oct. 18, 2005

(54) SILICON CARBIDE POWER METAL-OXIDE SEMICONDUCTOR FIELD EFFECT TRANSISTORS HAVING A SHORTING CHANNEL AND METHODS OF FABRICATING SILICON CARBIDE METAL-OXIDE SEMICONDUCTOR FIELD EFFECT TRANSISTORS HAVING A SHORTING CHANNEL

(75) Inventors: Sei-Hyung Ryu, Cary, NC (US); Anant Agarwal, Chapel Hill, NC (US); Mrinal Kanti Das, Durham, NC (US); Lori A. Lipkin, Raleigh, NC (US); John W. Palmour, Raleigh, NC (US); Ranbir Singh, Apex, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 09/911,995

(22) Filed: Jul. 24, 2001

(65) Prior Publication Data

US 2002/0038891 A1 Apr. 4, 2002

Related U.S. Application Data

(60) Provisional application No. 60/237,426, filed on Oct. 3, 2000, provisional application No. 60/237,822, filed on Oct. 3, 2000, and provisional application No. 60/294,307, filed on May 30, 2001.

(51) Int. Cl.$^7$ ............................................. H01L 29/161
(52) U.S. Cl. ........................ 257/77; 257/260; 257/262; 257/335; 257/410; 257/411
(58) Field of Search .................. 257/77, 260, 262, 257/335, 410, 411

(56) References Cited

U.S. PATENT DOCUMENTS

| | | | |
|---|---|---|---|
| 3,924,024 A | 12/1975 | Naber et al. ................... | 427/95 |
| 4,466,172 A | 8/1984 | Batra ........................... | 29/571 |

(Continued)

FOREIGN PATENT DOCUMENTS

| | | |
|---|---|---|
| DE | 198 09 554 | 9/1998 |
| DE | 198 32 329 A1 | 2/1999 |

(Continued)

OTHER PUBLICATIONS

Mutin, P. Herbert, "Control of the Composition and Structure of Silicon Oxycarbide and Oxynitride Glasses Derived from Polysiloxane Precursors," *Journal of Sol–Gel Science and Technology*. vol. 14 (1999) pp. 27–38.

del Prado et al. "Full Composition Range Silicon Oxynitride Films Deposited by ECR–PECVD at Room Temperatures," *Thin Solid Films*. vol. 343–344 (1999) p. 437–440.

(Continued)

*Primary Examiner*—Gene M. Munson
(74) *Attorney, Agent, or Firm*—Myers Bigel Sibley & Sajovec

(57) ABSTRACT

Silicon carbide metal-oxide semiconductor field effect transistors (MOSFETs) and methods of fabricating silicon carbide MOSFETs are provided. The silicon carbide MOSFETs have an n-type silicon carbide drift layer, spaced apart p-type silicon carbide regions in the n-type silicon carbide drift layer and having n-type silicon carbide regions therein, and a nitrided oxide layer. The MOSFETs also have n-type shorting channels extending from respective ones of the n-type silicon carbide regions through the p-type silicon carbide regions to the n-type silicon carbide drift layer. In further embodiments, silicon carbide MOSFETs and methods of fabricating silicon carbide MOSFETs are provided that include a region that is configured to self-deplete the source region, between the n-type silicon carbide regions and the drift layer, adjacent the oxide layer, upon application of a zero gate bias.

44 Claims, 16 Drawing Sheets

U.S. PATENT DOCUMENTS

| | | | |
|---|---|---|---|
| 4,875,083 A | 10/1989 | Palmour | 357/23.6 |
| 5,170,231 A * | 12/1992 | Fujii et al. | 257/77 |
| 5,170,455 A | 12/1992 | Goossen et al. | 385/89 |
| 5,184,199 A | 2/1993 | Fujii et al. | 29/10 |
| 5,479,316 A | 12/1995 | Smrtic et al. | 361/322 |
| 5,506,421 A | 4/1996 | Palmour | 257/77 |
| 5,510,630 A | 4/1996 | Agarwal | 257/77 |
| 5,587,870 A | 12/1996 | Anderson et al. | 361/313 |
| 5,726,463 A | 3/1998 | Brown et al. | 257/77 |
| 5,739,564 A | 4/1998 | Kosa et al. | 257/298 |
| 5,763,905 A | 6/1998 | Harris | 257/77 |
| 5,837,572 A | 11/1998 | Gardner et al. | 438/199 |
| 5,877,045 A | 3/1999 | Kapoor | 438/151 |
| 5,885,870 A | 3/1999 | Maiti et al. | 438/261 |
| 5,939,763 A | 8/1999 | Hao et al. | 257/411 |
| 5,960,289 A | 9/1999 | Tsui et al. | 438/257 |
| 5,972,801 A | 10/1999 | Lipkin et al. | 438/770 |
| 6,025,608 A | 2/2000 | Harris et al. | 257/77 |
| 6,028,012 A | 2/2000 | Wang | 438/779 |
| 6,048,766 A | 4/2000 | Gardner et al. | 438/257 |
| 6,054,352 A | 4/2000 | Ueno | 438/268 |
| 6,063,698 A | 5/2000 | Tseng et al. | 438/585 |
| 6,096,607 A | 8/2000 | Ueno | 438/522 |
| 6,100,169 A | 8/2000 | Suvorov et al. | 438/519 |
| 6,107,142 A | 8/2000 | Suvorov et al. | 438/285 |
| 6,117,735 A | 9/2000 | Ueno | 438/268 |
| 6,136,728 A | 10/2000 | Wang | 438/773 |
| 6,165,822 A | 12/2000 | Okuno et al. | 438/142 |
| 6,190,973 B1 | 2/2001 | Berg et al. | 438/275 |
| 6,204,135 B1 | 3/2001 | Peters et al. | 438/301 |
| 6,204,203 B1 | 3/2001 | Narwanker et al. | 438/785 |
| 6,211,035 B1 | 4/2001 | Moise et al. | 438/396 |
| 6,221,700 B1 | 4/2001 | Okuno et al. | 438/151 |
| 6,228,720 B1 | 5/2001 | Kitabatake et al. | 438/268 |
| 6,238,967 B1 | 5/2001 | Shiho et al. | 438/244 |
| 6,239,463 B1 | 5/2001 | Williams et al. | 257/328 |
| 6,246,076 B1 | 6/2001 | Lipkin et al. | 257/77 |
| 6,297,172 B1 | 10/2001 | Kashiwagi | 438/773 |
| 6,316,791 B1 | 11/2001 | Schörner et al. | 257/77 |
| 6,344,663 B1 | 2/2002 | Slater, Jr. et al. | 257/77 |
| 6,399,996 B1 | 6/2002 | Chang et al. | 257/484 |
| 6,420,225 B1 | 7/2002 | Chang et al. | 438/237 |
| 6,448,160 B1 | 9/2002 | Chang et al. | 438/527 |
| 6,455,892 B1 * | 9/2002 | Okuno et al. | 257/77 |
| 6,573,534 B1 | 6/2003 | Kumar et al. | 257/77 |
| 6,593,620 B1 | 7/2003 | Hshieh et al. | 257/335 |
| 6,610,366 B2 | 8/2003 | Lipkin | 427/378 |
| 2001/0055852 A1 | 12/2001 | Moise et al. | 438/396 |
| 2002/0072247 A1 | 6/2002 | Lipkin et al. | 438/767 |

FOREIGN PATENT DOCUMENTS

| | | |
|---|---|---|
| DE | 10036208 | 2/2002 |
| EP | 0 637 069 A1 | 2/1995 |
| EP | 0 637 069 B1 | 1/2001 |
| JP | 03157974 | 7/1991 |
| JP | 08264766 | 10/1996 |
| JP | 09205202 | 8/1997 |
| JP | 11191559 | 7/1999 |
| JP | 11238742 | 8/1999 |
| JP | 11261061 | 9/1999 |
| JP | 11266017 | 9/1999 |
| JP | 11274487 | 10/1999 |
| JP | 2000049167 | 2/2000 |
| JP | 2000082812 | 3/2000 |
| JP | 02000252461 A | 9/2000 |
| WO | WO 97/17730 | 5/1997 |
| WO | WO 97/39485 | 10/1997 |
| WO | WO98/02924 | 1/1998 |
| WO | WO99/63591 | 12/1999 |
| WO | WO00/13236 | 3/2000 |

OTHER PUBLICATIONS

Wang et al. "High Temperature Characteristics of High–Quality SiC MIS Capacitors with O/N/O Gate Dielectric," *IEEE Transactions on Electron Devices*. vol. 47, No. 2, Feb. 2000.

Dimitrijev et al., "Nitridation of Silicon–Dioxide Films Grown on 6H Silicon Carbide", *IEEE Electronic Device Letters*, vol. 18, No. 5, May 5, 1997, pp. 175–177.

De Mao et al., "Thermal Oxidation of SiC in $N_2O$", *J. Electrochem. Soc.*, vol. 141, 1994, pp. L150–L152.

Ryu et al., Article and Presentation: "27 $m\Omega$–$cm^2$, 1.6 kV Power DiMOSFETs in 4H–SiC," *Proceedings of the 14 International Symposium on Power Semiconductor Devices & ICs 2002*, Jun. 4–7, 2002, Santa Fe, NM.

Kobayashi et al. "Dielectric Breakdown and Current Conduction of Oxide/Nitride/Oxide Multi–Layer Structures," *1990 IEEE Symposium on VLSI Technology*. pp. 119–120.

Ma et al. "Fixed and trapped charges at oxide–nitride–oxide heterostructure interfaces formed by remote plasma enhanced chemical vapor deposition," *J. Vac. Sci. Technol. B*. vol. 11, No. 4, Jul./Aug. 1993, pp. 1533–1540.

Cho et al. "Improvement of charge trapping by hydrogen post–oxidation annealing in gate oxide of 4H–SiC methel–oxide–semiconductor capacitors," *Applied Physics Letters*. vol. 77, No. 8, pp. 1215–1217.

Fukuda et al. "Improvement of $SiO_2$/4H–SiC Interface Using High–Temperature Hydrogen Annealing at Low Pressure and Vacuum Annealing," *Jpn J. Appl. Phys.* vol. 38, Apr. 1999, pp. 2306–2309.

Suzuki et al. "Effect of Post–oxidation–annealing in Hydrogen on $SiO_2$/4H–SiC Interface," *Materials Science Forum*, vols. 338–342 (2000) 1073–1076.

Leonhard et al. "Long term stability of gate–oxides on n– and p–type silicon carbide studied by charge injection techniques," *Materials Science Engineering*, vol. 46, No. 1–3, Apr. 1997, pp. 263–266.

Fukuda et al. "Improvement of $SiO_2$/4H–SiC Interface by Using High Temperature Hydrogen Annealing at 1000° C," *Extended Abstracts of the International Conference on Solid State Devices and Materials*. Japan Society of Applied Physics, Tokyo, Japan, Sep. 1998.

Chang et al. "Observation of a Non–stoichiometric Layer at the Silicon Dioxide—Silicon Carbide Interface: Effect of Oxidation Temperature and Post–Oxidation Processing Conditions," *Mat. Res. Soc. Symp. Proc.*

M. K. Das, L.A. Lipkin, J.W. Palmour, G.Y. Chung, J.R. Williams, K. McDonald, and L.C. Feldman, "High Mobility 4H–SiC Inversion Mode MOSFETs Using Thermally Grown, NO Annealed $SiO_2$," *IEEE Device Research Conference*, Denver, CO Jun. 19–21, 2000.

G.Y. Chung, C.C. Tin, J.R. Williams, K. McDonald, M. Di Ventra, S.T. Pantelides, L.C. Feldman, and R.A. Weller, "Effect of nitric oxide annealing on the interface trap densities near the band edges in 4H." *Applied Physics Letters*, vol. 76, No. 13, pp. 1713–1715, Mar. 2000.

P.T. Lai, Supratic Chakraborty, C.L. Chan, and Y.C. Cheng, "Effects of nitridation and annealing on interface properties of thermally oxidized $SiO_2$/SiC metal–oxide–semiconductor system," *Applied Physics Letters*, vol. 76, No. 25, pp. 3744–3746, Jun. 2000.

J.P. Xu, P.T. Lai, C.L. Chan, B. Li, and Y.C. Cheng, "Improved Performance and Reliability of $N_2O$–Grown Oxynitride on 6H–SiC," *IEEE Electron Device Letters*, vol. 21, No. 6, pp. 298–300, Jun. 2000.

L.A. Lipkin and J.W. Palmour, "Low interface state density oxides on p–type SiC," *Materials Science Forum* vols. 264–268, pp. 853–856, 1998.

A.K. Agarwal, J.B. Casady, L.B. Rowland, W.F. Valek, M.H. White, and C.D. Brandt, "1.1 kV 4H–SiC Power UMOSFET's," *IEEE Electron Device Letters*, vol. 18, No. 12, pp. 586–588, Dec. 1997.

A.K. Agarwal, J.B. Casady, L.B. Rowland, W.F. Valek, and C.D. Brandt, "1400 V 4H–SiC Power MOSFET's," *Materials Science Forum* vols. 264–268, pp. 989–992, 1998.

J. Tan, J.A. Cooper, Jr., and Mr.R. Melloch, "High–Voltage Accumulation–Layer UMOSFETs in 4H–SiC," *IEEE Electron Device Letters*, vol. 19, No. 12, pp. 487–489, Dec. 1998.

J.N. Shenoy, J.A. Cooper and M.R. Meelock, "High–Voltage Double–Implanted Power MOSFETs in 6H–SiC," *IEEE Electron Device Letters*, vol. 18, No. 3, pp. 93–95, Mar. 1997.

J.B. Casady, A.K. Agarwal, L.B. Rowland, W.F. Valek, and C.D. Brandt, "900 V DMOS and 1100 V UMOS 4H–SiC Power FETs," *IEEE Device Research Conference*, Ft. Collins, CO Jun. 23–25, 1997.

R. Schörner, P. Friedrichs, D. Peters, H. Mitlehner, B. Weis, and D. Stephani, "Rugged Power MOSFETs in 6H–SiC with Blocking Capability up to 1800 V," *Materials Science Forum* vols. 338–342, pp. 1295–1298, 2000.

V.R. Vathulya and M.H. White, "Characterization of Channel Mobility on Implanted SiC to Determine Polytype Suitability for the Power DIMOS Structure," *Electronic Materials Conference*, Santa Barbara, CA, Jun. 30–Jul. 2, 1999.

A.V. Suvorov, L.A. Lipkin, G.M. Johnson, R. Singh and J.W. Palmour, "4H–SiC Self–Aligned Implant–Diffused Structure for Power DMOSFETs," *Materials Science Forum* vols. 338–342, pp. 1275–1278, 2000.

R. Schorner, P. Friedrichs, D. Peters, and D. Stephani, "Significantly Improved Performance of MOSFETs on Silicon Carbide Using the 15R–SiC Polytype," *IEEE Electron Device Letters*, vol. 20, No. 5, pp. 241–244, May 1999.

S.T. Pantelides, "Atomic Scale Engineering of SiC Dielectric Interfaces," DARPA/MTO High Power and ONR Power Switching MURI Reviews, Rosslyn, VA, Aug. 10–12, 1999.

V.V. Afanas'ev, M. Bassler, G. Pensl, and M. Schulz, "Intrinsic $SiC/SiO_2$ Interface States," *Phy. Stat. Sol. (a)*, vol. 162, pp. 321–337, 1997.

S. Sridevan, P.K. McLarty, and B.J. Baliga, "On the Presence of Aluminum in Thermally Grown Oxides on 6H–Silicon Carbide," *IEEE Electron Device Letters*, vol. 17, No. 3, pp. 136–138, Mar. 1996.

M.A. Capano, S.Ryu, J.A. Cooper, Jr., M.R. Melloch, K. Rottner, S. Karlsson, N. Nordell, A. Powell, and D.E. Walker, Jr., "Surface Roughening in Ion Implanted 4H–Silicon Carbide," *Journal of Electronic Materials*, vol. 28, No. 3, pp. 214–218, Mar. 1999.

M.K. Das, J.A. Cooper, Jr., M.R. Melloch, and M.A. Capano, "Inversion Channel Mobility in 4H– and 6H–SiC MOSFETs," *IEEE Semiconductor Interface Specialists Conference*, San Diego, CA, Dec. 3–5, 1998.

P.M. Shenoy and B.J. Baliga, "The Planar 6H–SiC ACCUFET: A New High–Voltage Power MOSFET Structure," *IEEE Electron Device Letters*, vol. 18, No. 12, pp. 589–591, Dec. 1997.

Ranbir Singh, Sei–Hyung Ryu and John W. Palmour, "High Temperature, High Current, 4H–SiC Accu–DMOSFET," *Materials Science Forum* vols. 338–342, pp. 1271–1274, 2000.

Y. Wang, C. Weitzel, and M. Bhatnagar, "Accumulation-Mode SiC Power MOSFET Design Issues," *Materials Science Forum*, vols. 338–342, pp. 1287–1290.

A.K. Agarwal, N.S. Saks, S.S. Mani, V.S. Hegde and P.A. Sanger, "Investigation of Lateral RESURF, 6H–SiC MOSFETs," *Materials Science Forum*, vols. 338–342, pp. 1307–1310, 2000.

S. Sridevan and B. Jayant Baliga, "Lateral N–Channel Inversion Mode 4H–SiC MOSFET's," *IEEE Electron Device Letters*, vol. 19, No. 7, pp. 228–230, Jul. 1998.

D. Alok, E. Arnold, and R. Egloff, "Process Dependence of Inversion Layer Mobility in 4H–SiC Devices," *Materials Science Forum*, vols. 338–342, pp. 1077–1080, 2000.

K. Ueno and Tadaaki Oikawa, "Counter–Doped MOSFET's of 4H–SiC." *IEEE Electron Device Letters*, vol. 20, No. 12, pp. 624–626, Dec. 1999.

V. R. Vathulya, H. Shang, and M. H. White, "A Novel 6H–SiC Power DMOSFET with Implanted P–Well Spacer." *IEEE Electron Device Letters*, vol. 20, No. 7, Jul. 1999, pp. 354–356.

A.K. Agarwal, S. Seshadri, and L. B. Rowland, "Temperature Dependence of Fowler–Nordheim Current in 6H–and 4H–SiC MOS Capacitors." *IEEE Electron Device Letters*, vol. 18, No. 12, Dec. 1997, pp. 592–594.

P. J. Tobin, Y. Okada, S. A. Ajuria, V. Lakhotia, W. A Feil, and R. I. Hedge, "Furnace formation of silicon oxynitride thin dielectrics in nitrous oxide ($N_2O$): The role of nitric oxide (NO)." *Journal of Applied Physics*. vol. 75, No. 3, Feb. 1, 1994, pp. 1811–1817.

Sze, S.M. *Physics of Semiconductor Devices*, John Wiley & Sons, p. 383–390, (1981).

H.F. Li, S. Dimitrijev, H.B. Harrison, D. Sweatman, and P.T. Tanner. "Improving $SiO_2$ Grown on P–Type 4H–SiC by NO Annealing." *Materials Science Forum*. vols. 264–268 (1998) pp. 869–872.

K. Ueno, R. Asai, and T. Tsuji. "4H–SiC MOSFET's Utilizing the $H_2$ Surface Cleaning Technique." *IEEE Electron Device Letters*, vol. 19, No. 7, Jul. 1998, pp. 244–246.

Chung et al. "The Effect of Si:C Source Ratio on $SiO_2$/SiC Interface State Density for Nitrogen Doped 4H and 6H–SiC," *Materials Science Forum*. (2000) vols. 338–342, pp. 1097–1100.

Pantelides et al. "Atomic–Scale Engineering of the $SiCSiO_2$ Interface," *Materials Science Forum*. (2000) vols. 338–342, pp. 1133–1136.

Chakraborty et al. "Interface Properties of $N_2O$–annealed $SiO_2$/SiC system," *Proceedings IEEE Hong Kong Electron Devices Meeting*. Jun. 24, 2000, pp. 108–111.

Lipkin et al. "Insulator Investigation on SiC for Improved Reliability," *IEEE Transactions on Electron Devices*. vol. 46, No. 3, Mar. 1999, pp. 525–532.

Copy of International Search Report for PCT/US01/30715.

Lipkin et al. "Challenges and State–of–the–Art Oxides in SiC," *Mat. Res. Soc. Symp. Proc.* vol. 640, Nov. 2000, pp. 27–29.

Jamet, et al. "Physical properties of $N_2O$ and NO–nitrided gate oxides grown on 4H SiC," *Applied Physics Letters*. vol. 79, No. 3, Jul. 16, 2001, pp. 323–325.

International Search Report, PCT/US 01/42414, Apr. 23, 2002, 10 pages.

Agarwal et al. "A Critical Look at the Performance Advantages and Limitations of 4H–SiC Power UMOSFET Structures," *1996 IEEE ISPSD and IC's Proc.*, May 20–23, 1996, pp. 119–122.

Lei et al. "Interface Properties of $N_2O$–Annealed $NH_3$–Treated 6H–SiC MOS Capacitor," *Proc. 1999 IEEE Hong Kong Electron Devices Meeting*, Jun. 26, 1999, pp. 46–49.

G.Y. Chung, C.C. Tin, J.R. Williams, K. McDonald, R.A. Weller, S.T. Pantelides, L.C. Feldman, M.K. Das, and J.W. Palmour, "Improved Inversion Channel Mobility for 4H–SiC MOSETs Following High Temperature Anneals in Nitric Oxide," *IEEE Electron Device Letters* accepted for publication 2000 and published in vol. 22, No. 4, Apr. 2001.

Das, Mrinai K. Graduate thesis entitled, *Fundamental Studies of the Silicon Carbide MOS Structure*. Purdue University, Dec. 1999.

Williams et al., "Passivation of the 4–H $SiC/SiO_2$ Interface with Nitric Oxide", *Materials Science Forum*, vols. 389–393, 2002, pp. 967–972.

Chung et al., "Effects of Anneals in Ammonia on the Interface Trap Density Near the Band Edges in 4H–Silicon Carbide Metal–Oxide–Semiconductor Capacitors", *Applied Physics Letters*, vol. 77, No. 22, Nov. 27, 2000, pp. 3601–3603.

* cited by examiner

SILICON CARBIDE POWER METAL-OXIDE SEMICONDUCTOR FIELD EFFECT TRANSISTORS HAVING A SHORTING CHANNEL AND METHODS OF FABRICATING SILICON CARBIDE METAL-OXIDE SEMICONDUCTOR FIELD EFFECT TRANSISTORS HAVING A SHORTING CHANNEL

RELATED APPLICATIONS

The present application claims priority from U.S. Provisional Application Ser. No. 60/237,822, entitled "Method of Improving an Interface Between a Silicon Carbide Layer and an Oxide Layer," U.S. Provisional Application Ser. No. 60/237,426 entitled "SiC Power MOSFET and Method of Fabrication" which were filed Oct. 3, 2000, U.S. Provisional Application Ser. No. 60/294,307 entitled "Method of $N_2O$ Growth of an oxide layer on a Silicon Carbide Layer" filed May 30, 2001, and U.S. patent application Ser. No. 09/834,283, entitled "Method of $N_2O$ Annealing an oxide layer on a Silicon Carbide Layer" filed Apr. 12, 2001, the disclosures of which are incorporated by reference as if set forth fully herein.

STATEMENT OF GOVERNMENT INTEREST

The present invention was made, at least in part, with support from United States Office of Naval Research contract number N00014-99-C-0377. The government may have certain rights in this invention.

FIELD OF THE INVENTION

The present invention relates to semiconductor devices and the fabrication of semiconductor devices and more particularly, to silicon carbide (SiC) metal-oxide semiconductor transistors (MOSFETs) and the fabrication of such MOSFETs.

BACKGROUND OF THE INVENTION

To make a high current, high voltage, low on-resistance, vertical SiC power MOSFET has, so far, been impractical, at least in part, due to the poor surface mobility of electrons in the inversion layer. Recently, some processing techniques have been developed on a lateral MOSFET structure, which result in an improved surface electron mobility. However, a power MOSFET structure may involve additional processing including, for example, anneals at temperatures of greater than 1500° C. for the activation of p-type dopants, for example, p-well/p+ contact/p-Junction Termination Extension (JTE) implants. Such anneals may have detrimental impact on the performance of power MOSFETs fabricated using such techniques.

A number of silicon carbide power MOSFET structures have been described in the literature. See e.g. U.S. Pat. No. 5,506,421; A. K. Agarwal, J. B. Casady, L. B. Rowland, W. F. Valek, M. H. White, and C. D. Brandt, "1.1 kV 4H—SiC Power UMOSFET's," IEEE Electron Device Letters, Vol. 18, No. 12, pp. 586–588, December 1997; A. K. Agarwal, J. B. Casady, L. B. Rowland, W. F. Valek and C. D. Brandt, "1400 V 4H—SiC Power MOSFETs," Materials Science Forum Vols. 264–268, pp. 989–992, 1998; J. Tan, J. A. Cooper, Jr., and M. R. Melloch, "High-Voltage Accumulation-Layer UMOSFETs in 4H—SiC," IEEE Electron Device Letters, Vol. 19, No. 12, pp. 487–489, December 1998; J. N. Shenoy, J. A. Cooper and M. R. Melloch, "High-Voltage Double-Implanted Power MOSFET's in 6H—SiC," IEEE Electron Device Letters, Vol. 18, No. 3, pp. 93–95, March 1997; J. B. Casady, A. K. Agarwal, L. B. Rowland, W. F. Valek, and C. D. Brandt, "900 V DMOS and 1100 V UMOS 4H—SiC Power FETs," IEEE Device Research Conference, Ft. Collins, Colo., June 23–25, 1997; R. Schörner, P Friedrichs, D. Peters, H. Mitlehner, B. Weis and D. Stephani, "Rugged Power MOSFETs in 6H—SiC with Blocking Capability up to 1800 V," Materials Science Forum Vols. 338–342, pp. 1295–1298, 2000; V. R. Vathulya and M. H. White, "Characterization of Channel Mobility on Implanted SiC to determine Polytype suitability for the Power DIMOS structure," Electronic Materials Conference, Santa Barbara, Calif., Jun. 30–Jul. 2, 1999; A. V. Suvorov, L. A. Lipkin, G. M. Johnson, R. Singh and J. W. Palmour, "4H—SiC Self-Aligned Inplant-Diffused Structure for Power DMOSFETs," Materials Science Forum Vols. 338–342, pp. 1275–1278, 2000; P. M. Shenoy and B. J. Baliga, "The Planar 6H—SiC ACCUFET: A New High-Voltage Power MOSFET Structure," IEEE Electron Device Letters, Vol. 18, No. 12, pp. 589–591, December 1997; Ranbir Singh, Sei-Hyung Ryu and John W. Palmour, "High Temperature, High Current, 4H—SiC Accu-DMOSFET," Materials Science Forum Vols. 338–342, pp. 1271–1274, 2000; Y. Wang, C. Weitzel and M. Bhatnagar, "Accumulation-Mode SiC Power MOSFET Design Issues," Materials Science Forum Vols. 338–342, pp. 1287–1290, 2000; and A. K. Agarwal, N. S. Saks, S. S. Mani, V. S. Hegde and P. A. Sanger, "Investigation of Lateral RESURF, 6H—SiC MOSFETs," Materials Science Forum Vols. 338–342, pp. 1307–1310, 2000.

The existing SiC structures can be divided into three categories: (1) Trench or UMOSFET, (2) Vertical Doubly Implanted MOSFET (DIMOSFET), and (3) Lateral Diffused MOSFET (LDMOSFET). These structures are shown in FIGS. 1A, 1B, 1C and 1D. With the Trench MOSFET illustrated in FIG. 1A, however, it may be difficult to achieve a high breakdown voltage and a reproducible high inversion layer mobility along the sidewalls of the trench. Consequently, the on-resistance may become very high, which may render the structure impractical. The lateral DMOSFET, illustrated in FIGS. 1C and 1D, may suffer from high electric field in the gate oxide and higher on-resistance as compared to the vertical DIMOSFET for a given breakdown voltage.

The vertical DIMOSFET structure, illustrated in FIG. 1B, is a variation of the Diffused (DMOSFET) structure employed in silicon technology. Typically, the p-wells are implanted with Al or Boron, the source regions (n$^+$) are implanted with nitrogen or phosphorus, and the p$^+$ regions are usually implanted with Al. The implants are activated at temperatures between 1400° C.–1700° C. The contacts to n$^+$ layers are made with nickel (Ni) and annealed and the contacts to p$^+$ are made by Ni, Ti or Ti/Al. Both contacts are annealed at high temperatures. The gate dielectric is, typically, either thermally grown (Thermal $SiO_2$) or deposited using Low Pressure Chemical Vapor Deposition (LPCVD) technique and subsequently annealed in various ambients. The deposited dielectric may be $SiO_2$ or an Oxide/Nitride/Oxide (ONO) stack. One difficulty with the DIMOSFET structure may be the poor mobility of inversion layer electrons, which can result in a very high on-resistance. The cause of such a problem has been attributed to a high density of interface states near the conduction band edge as shown in FIG. 2. See R. Schorner, P. Friedrichs, D. Peters, and D. Stephani, "Significantly Improved Performance of MOSFETs on Silicon Carbide using the 15R—SiC Polytype," IEEE Electron Device Letters, Vol. 20, No. 5, pp. 241–244, May 1999.

The interface states near the conduction band edge tend to trap the otherwise free electrons from the inversion layer leaving a relatively small number of free electrons in the inversion layer. Also the trapped electrons may create negatively charged states at the interface which coulomb scatter the free electrons. The reduced number of free electrons and the increased scattering may reduce the conduction of current from source to drain, which may result in low effective mobility of electrons and a high on-resistance. Several factors have been attributed to the high density of states near the conduction band edge: (1) carbon or silicon dangling bonds, (2) carbon clusters, and (3) Si—Si bonds creating a thin amorphous silicon layer at the interface. See S. T. Pantelides, "Atomic Scale Engineering of SiC Dielectric Interfaces," DARPA/MTO High Power and ONR Power Switching MURI Reviews, Rosslyn, Va., Aug. 10–12, 1999 and V. V. Afanas'ev, M. Bassler, G. Pensl, and M. Schulz, "Intrinsic $SiC/SiO_2$ Interface States," Phys. Stat. Sol. (a), Vol. 162, pp. 321–337, 1997.

In addition to the high density of interface states, several other mechanisms have also been attributed to the poor mobility of inversion layer electrons: (1) Al segregating out of the Al-doped, p-type SiC, and (2) Surface roughness created by the high temperature activation of implanted impurities. See S. Sridevan, P. K. McLarty, and B. J. Baliga, "On the Presence of Aluminum in Thermally Grown Oxides on 6H-Silicon Carbide," IEEE Electron Device Letters, Vol. 17, No. 3, pp. 136–138, March 1996 and M. A. Capano, S. Ryu, J. A. Cooper, Jr., M. R. Melloch, K. Rottner, S. Karlsson, N. Nordell, A. Powell, and D. E. Walker, Jr., "Surface Roughening in Ion Implanted 4H-Silicon Carbide," Journal of Electronic Materials, Vol. 28, No. 3, pp. 214–218, March, 1999. Researchers from Purdue University have concluded that a direct correlation exists between the inversion layer electron mobility and the implant activation temperature. Such research has concluded that lower implant activation temperature (1200° C.) leads to higher electron mobility and higher activation temperature (1400° C.) results in poor electron mobility. See M. K. Das, J. A. Cooper, Jr., M. R. Melloch, and M. A. Capano, "Inversion Channel Mobility in 4H— and 6H—SiC MOSFETs," IEEE Semiconductor Interface Specialists Conference, San Diego, Calif., Dec. 3–5, 1998. These results have been obtained on planar MOSFETs (FIG. 3), which do not utilize an implantation of the p-well. The p-well implanted impurity (Al or Boron) typically requires at least a 1500° C. activation temperature.

The so-called "ACCUFET" structure is shown in FIG. 4. It results in high electron mobility due to conduction across an accumulation layer instead of an inversion layer. In this structure, the p-well is implanted using Al in such a manner so as to leave a thin unimplanted n-type surface layer. This n-type layer is fully depleted due to the built-in voltage of the pn junction. However, the implant activation temperature is typically limited to 1400° C. to avoid surface roughness as indicated before. The doping of the remaining n-layer is the same as the doping of the grown n-type layer. This structure has shown high electron mobility in 6H—SiC but very poor electron mobility in 4H—SiC.

Sridevan and Alok have reported high electron mobility in 4H—SiC in a planar MOSFET on a p-type epitaxial layer (p-epi). S. Sridevan and B. Jayant Baliga, "Lateral N-Channel Inversion Mode 4H—SiC MOSFET's," IEEE Electron Device Letters, Vol. 19, No. 7, pp. 228–230, July 1998; D. Alok, E. Arnold, and R. Egloff, "Process Dependence of Inversion Layer Mobility in 4H—SiC Devices," Materials Science Forum Vols. 338–342, pp. 1077–1080, 2000. However, this is not a high voltage power MOSFET structure. By using p-epi, the problems associated with p-well activation and resulting surface roughness may potentially be avoided. A deposited oxide was used and the activation temperature of nitrogen implants for the source and drain regions kept to a minimum (1250° C.) to avoid surface roughness. The contacts to the source and drain regions were not annealed in order to protect the gate oxide/SiC interface. The high electron mobility has been attributed to the special wet anneal of the deposited $SiO_2$ layer. This anneal was done at 1100° C. in $N_2$ bubbled through de-ionized (DI) water at 98° C. for 400 min, followed by an in situ Ar anneal at 1100° C. for 60 min, followed by a 950° C. wet $N_2$ anneal for 60 min. The anneal was performed to densify the deposited oxide and reduce the interface state density. Unfortunately, this approach suffers from reproducibility. Several groups, including researches at Rensealar Polytechnic Institute (RPI), Purdue University, and Cree, Inc. have been unsuccessful in their attempts to duplicate this result.

Another method that has been reported as showing promise is the counter-doping method. K. Ueno and Tadaaki Oikawa, "Counter-Doped MOSFET's of 4H—SiC," IEEE Electron Device Letters, Vol. 20, No. 12, pp. 624–626, December 1999. Again, this technique has been implemented on planar MOSFETs without the p-well implant. This is not a high voltage power MOSFET structure. By using p-epi, the problems associated with p-well activation and resulting surface roughness may be avoided. In the counter-doping method, a thin layer of n-type impurity such as Nitrogen is implanted between the source and drain. The implant is activated at a low temperature (1300° C.) to avoid surface roughness. The doping density of the n-type region can be controlled by controlling the dose and energy of the n-type implant. By relaxing the surface field with this implant, higher channel mobilities have been reported.

Recently, annealing of a thermal oxide in a nitric oxide (NO) ambient has shown promise in a planar 4H—SiC MOSFET structure not requiring a p-well implant. See M. K. Das, L. A. Lipkin, J. W. Palmour, G. Y. Chung, J. R. Williams, K. McDonald, and L. C. Feldman, "High Mobility 4H—SiC Inversion Mode MOSFETs Using Thermally Grown, NO Annealed $SiO_2$," IEEE Device Research Conference, Denver, Colo., Jun. 19–21, 2000 and G. Y. Chung, C. C. Tin, J. R. Williams, K. McDonald, R. A. Weller, S. T. Pantelides, L. C. Feldman, M. K. Das, and J. W. Palmour, "Improved Inversion Channel Mobility for 4H—SiC MOSFETs Following High Temperature Anneals in Nitric Oxide," IEEE Electron Device Letters accepted for publication, the disclosures of which are incorporated by reference as if set forth fully herein. This anneal is shown to significantly reduce the interface state density near the conduction band edge. G. Y. Chung, C. C. Tin, J. R. Williams, K. McDonald, M. Di Ventra, S. T. Pantelides, L. C. Feldman, and R. A. Weller, "Effect of nitric oxide annealing on the interface trap densities near the band edges in the 4H polytype of silicon carbide," Applied Physics Letters, Vol. 76, No. 13, pp. 1713–1715, March 2000, the disclosure of which is incorporated herein as if set forth fully. High electron mobility (35–95 $cm^2/Vs$) is obtained in the surface inversion layer due to the improved MOS interface.

Unfortunately, NO is a health hazard having a National Fire Protection Association (NFPA) health danger rating of 3, and the equipment in which post-oxidation anneals are typically performed is open to the atmosphere of the cleanroom. They are often exhausted, but the danger of exceeding a safe level of NO contamination in the room is not negligible.

Growing the oxide in $N_2O$ is possible. J. P. Xu, P. T. Lai, C. L. Chan, B. Li, and Y. C. Cheng, "Improved Performance and Reliability of $N_2O$-Grown Oxynitride on 6H—SiC," IEEE Electron Device Letters, Vol. 21, No. 6, pp. 298–300, June 2000, the disclosure of which is incorporated by reference as if set forth fully herein. Post-growth nitridation of the oxide on 6H—SiC in $N_2O$ at a temperature of 1100° C. has also been investigated by Lai et al. P. T. Lai, Supratic Chakraborty, C. L. Chan, and Y. C. Cheng, "Effects of nitridation and annealing on interface properties of thermally oxidized $SiO_2$/SiC metal-oxide-semiconductor system," Applied Physics Letters, Vol. 76, No. 25, pp. 3744–3746, June 2000, the disclosure of which is incorporated by reference as if set forth fully herein. However, Lai et al. concluded that such treatment deteriorates the interface quality which may be improved with a subsequent wet or dry anneal in $O_2$ which may repair the damage induced by nitridation in $N_2O$. Moreover, even with a subsequent $O_2$ anneal, Lai et al. did not see any significant reduction in interface state density as compared to the case without nitridation in $N_2O$. However, this work utilized 6H—SiC and it is not clear whether it would work on 4H—SiC, since many improvements to 6H—SiC MOSFETs have not previously resulted in any significant improvement in 4H—SiC MOSFETs.

SUMMARY OF THE INVENTION

Embodiments of the present invention provide silicon carbide metal-oxide semiconductor field effect transistors (MOSFETs) and methods of fabricating silicon carbide MOSFETs having an n-type silicon carbide drift layer, spaced apart p-type silicon carbide regions within the drift layer and having n-type silicon carbide regions therein, and an oxide layer on the drift layer. The MOSFETs also have n-type shorting channels extending from respective ones of the n-type silicon carbide regions to the n-type silicon carbide drift layer.

In particular embodiments of the present invention, the p-type silicon carbide regions are spaced apart regions of silicon carbide having aluminum implanted therein. In further embodiments of the present invention, the n-type shorting channels are self-aligned with respective ones of the p-type silicon carbide source regions.

In alternative embodiments of the present invention, an epitaxial layer of silicon carbide is provided on the n-type silicon carbide drift layer between the n-type shorting channels. In certain embodiments, the epitaxial layer of silicon carbide is on the n-type silicon carbide drift layer and the p-type silicon carbide source regions. In such embodiments of the present invention, the n-type shorting channels may extend into and/or through the epitaxial layer of silicon carbide.

In further embodiments of the present invention, a gate contact is provided on the oxide layer. In particular embodiments of the present invention, the gate contact is p-type polysilicon.

In still further embodiments of the present invention, the n-type shorting channels are doped so that the n-type channels are self depleted regions when a zero volt gate bias is applied. In particular embodiments of the present invention, the shorting channels have a sheet charge of less than about $10^{13}$ cm$^{-2}$. For example, the n-type shorting channels may have a sheet charge corresponding to the sheet charge of an epitaxial layer of silicon carbide having a thickness of about 3500 Å and a carrier concentration of about $2\times10^{16}$ cm$^{-3}$. Furthermore, for embodiments of the present invention in 4H polytype silicon carbide, the interface between the oxide layer and the n-type drift layer preferably has an interface state density of less than $10^{12}$ eV$^{-1}$cm$^{-2}$ for energy levels between about 0.3 and about 0.4 eV of a conduction band energy of 4H polytype silicon carbide.

In additional embodiments of the present invention, a silicon carbide device is provided having a drift layer of n-type silicon carbide and first regions of p-type silicon carbide in the drift layer. The first regions of p-type silicon carbide are spaced apart and have peripheral edges which define a region of the drift layer therebetween. First regions of n-type silicon carbide having a carrier concentration greater than a carrier concentration of the drift layer are provided in the first regions of p-type silicon carbide and are spaced apart from the peripheral edges of the first regions of p-type silicon carbide. Second regions of n-type silicon carbide having a carrier concentration less than the carrier concentration of the first regions of n-type silicon carbide extend from the first regions of n-type silicon carbide to the peripheral edges of the first regions of p-type silicon carbide. An oxide layer is provided on the drift layer, the first regions of n-type silicon carbide and the second regions of n-type silicon carbide.

In particular embodiments of the present invention, the second regions of n-type silicon carbide have a sheet charge of less than about $10^{13}$ cm$^{-2}$. For example, the second regions of silicon carbide may have a sheet charge corresponding to the sheet charge of an epitaxial layer of silicon carbide having a thickness of about 3500 Å and a carrier concentration of about $2\times10^{16}$ cm$^{-3}$. Furthermore, the second regions of n-type silicon carbide may have a depth of from about 0.05 µm to about 1 µm. The second regions of n-type silicon carbide may also extend a distance of from about 0.5 µm to about 5 µm from the first regions of n-type silicon carbide to the peripheries of the first regions of p-type silicon carbide.

In further embodiments of the present invention utilizing 4H polytype silicon carbide, the interface state density of an interface between the oxide layer and the drift layer, the first regions of n-type silicon carbide and the second regions of n-type silicon carbide is less than about $10^{12}$ eV$^{-1}$cm$^{-2}$ between about 0.3 and about 0.4 eV of the conduction band energy of 4H polytype silicon carbide.

In additional embodiments of the present invention, second regions of p-type silicon carbide disposed in respective ones of the first regions of p-type silicon carbide are provided. The second regions of p-type silicon carbide have a carrier concentration greater than the carrier concentration of the first regions of silicon carbide. The second regions of silicon carbide are also adjacent the first regions of n-type silicon carbide and opposite the second regions of n-type silicon carbide.

In particular embodiments of the present invention, the first regions of p-type silicon carbide are spaced apart by a distance of from about 1 µm to about 10 µm. The first regions of p-type silicon carbide may also have a carrier concentration of from about $1\times10^{16}$ to about $2\times10^{19}$ cm$^{-3}$.

Furthermore, source contacts on the first region of p-type silicon carbide and the first region of n-type silicon carbide may also be provided. A layer of n-type silicon carbide having a carrier concentration greater than the carrier concentration of the drift layer and disposed adjacent the drift layer opposite the oxide layer may also be provided. In such embodiments, a drain contact may be provided on the layer of n-type silicon carbide.

In still further embodiments of the present invention, an epitaxial layer of silicon carbide is provided on the first p-type regions and the drift layer of n-type silicon carbide. The second regions of n-type silicon carbide extend into the epitaxial layer, the first regions of n-type silicon carbide extend through the epitaxial layer and the oxide layer is on the epitaxial layer, the first regions of n-type silicon carbide and the second regions of n-type silicon carbide. The epitaxial layer may be undoped silicon carbide. The epitaxial layer may also be n-type silicon carbide having sheet charge of less than about $10^{13}$ cm$^2$. The epitaxial layer of silicon carbide may also be an epitaxial layer of silicon carbide having a thickness of from about 0.05 µm to about 1 µm. Preferably, the epitaxial layer of silicon carbide has a thickness of from about 1000 to about 5000 Å.

In additional embodiments of the present invention, second regions of p-type silicon carbide disposed in respective ones of the first regions of p-type silicon carbide are provided. The second regions of p-type silicon carbide have a carrier concentration greater than the carrier concentration of the first regions of silicon carbide and are adjacent the first regions of n-type silicon carbide and opposite the second regions of n-type silicon carbide. Windows in the epitaxial layer may be positioned to expose the second regions of p-type silicon carbide and first source contacts provided within the window on the second regions of p-type silicon carbide. Second source contacts may also be provided on the first source contacts and the first regions of n-type silicon carbide.

In various embodiments of the present invention, methods of fabricating a silicon carbide device include implanting p-type impurities in a layer of n-type silicon carbide so as to provide first regions of p-type silicon carbide, the first regions of p-type silicon carbide being spaced apart and having peripheral edges which define a region of the layer of n-type silicon carbide therebetween. N-type impurities are also implanted into the first regions of p-type silicon carbide to provide first regions of n-type silicon carbide having a carrier concentration greater than a carrier concentration of the layer of silicon carbide, the first regions of n-type silicon carbide being spaced apart from the peripheral edges of the first regions of p-type silicon carbide. N-type impurities are implanted into the first regions of p-type silicon carbide to provide second regions of n-type silicon carbide having a carrier concentration less than the carrier concentration of the first regions of n-type silicon carbide and which extend from the first regions of n-type silicon carbide to the peripheral edges of the first regions of p-type silicon carbide. An oxide layer is patterned on the drift layer, the first regions of n-type silicon carbide and the second regions of n-type silicon carbide so as to provide a gate oxide.

In particular embodiments, implanting p-type impurities, implanting n-type impurities to provide first regions of n-type silicon carbide and implanting n-type impurities to provide second regions of n-type silicon carbide are provided by patterning a first mask on the layer of n-type silicon carbide, the first mask having openings corresponding to the first regions of p-type silicon carbide so as to expose portions of the layer of n-type silicon carbide and then implanting p-type impurities into the layer of n-type silicon carbide utilizing the first mask and implanting n-type impurities into the first regions of p-type silicon carbide utilizing the first mask. A second mask is patterned on the layer of n-type silicon carbide, the second mask having openings corresponding to the first regions of n-type silicon carbide so as to expose portions of the layer of n-type silicon carbide having the p-type and n-type impurities implanted therein. N-type impurities are implanted into the layer of n-type silicon carbide utilizing the second mask.

In certain embodiments of the present invention, implanting n-type impurities into the layer of n-type silicon carbide utilizing the first mask is followed by activating the implanted impurities by annealing at a temperature of at least about 1500° C. Preferably, the p-type impurities are aluminum.

Furthermore, the second mask may be patterned so that the second regions of n-type silicon carbide extend a distance of from about 0.5 µm to about 5 µm from the first regions of n-type silicon carbide to the peripheries of the first regions of p-type silicon carbide. Also, impurities may be implanted so that the second regions of n-type silicon carbide have a sheet charge of less than about $10^{13}$ cm$^{-2}$. The n-type impurities may be implanted utilizing an implant energy so as to provide second regions of n-type silicon carbide have a depth of from about 0.05 µm to about 1 µm.

In particular embodiments of the present invention, the oxide layer is thermally grown. The oxide layer may also be provided by forming an oxide-nitride-oxide (ONO) layer. Preferably, the first oxide layer of the ONO structure is thermally grown. In any event, the oxide layer may be annealed in an NO environment or an N$_2$O environment. It is also preferred that the annealing provides an interface state density of an interface between the oxide layer and the drift layer, the first regions of n-type silicon carbide and the second regions of n-type silicon carbide of less than about $10^{12}$ eV$^{-1}$cm$^{-2}$ between about 0.3 and about 0.4 eV of the conduction band energy of 4H polytype silicon carbide. Such an interface state density may be determined as described in Sze, *Physics of Semiconductor Devices,* 2nd Edition, John Wiley & Sons, 1981, pp. 383–390.

In still further embodiments of the present invention, p-type impurities are implanted into the layer of n-type silicon carbide so as to provide second regions of p-type silicon carbide disposed in respective ones of the first regions of p-type silicon carbide. The second regions of p-type silicon carbide have a carrier concentration greater than the carrier concentration of the first regions of silicon carbide. The second regions of silicon carbide are also adjacent the first regions of n-type silicon carbide and opposite the second regions of n-type silicon carbide.

In certain embodiments of the present invention, the first mask has openings which are spaced apart by a distance of from about 1 µm to about 10 µm. Also, n-type impurities may be implanted into a face of the layer of n-type silicon carbide opposite the oxide layer so as to provide a second layer of n-type silicon carbide having a carrier concentration greater than the carrier concentration of the layer of n-type silicon carbide. A drain contact may then be formed on the second layer of n-type silicon carbide. Furthermore, the layer of n-type silicon carbide may be a silicon carbide substrate.

In still further embodiments of the present invention, implanting p-type impurities, implanting n-type impurities to provide first regions of n-type silicon carbide and implanting n-type impurities to provide second regions of n-type silicon carbide may be provided by patterning a first mask on the layer of n-type silicon carbide, the first mask having openings corresponding to the first regions of p-type silicon carbide so as to expose portions of the layer of n-type silicon carbide. Then p-type impurities (preferably, aluminum) are implanted into the layer of n-type silicon carbide utilizing the first mask and the layer of n-type silicon carbide and the first regions of p-type silicon carbide annealed at a temperature of at least about 1500° C. An epitaxial layer of silicon carbide is then grown on the layer of n-type silicon carbide and the first regions of p-type silicon carbide. A second mask is patterned on the layer of n-type silicon carbide. The second mask has openings corresponding to the second regions of n-type silicon carbide so as to expose portions of the first regions of p-type silicon carbide. N-type impurities are implanted into the epitaxial layer n-type silicon carbide utilizing the second mask. A third mask is patterned on the layer of n-type silicon carbide. The third mask has openings corresponding to the first regions of n-type silicon carbide and exposes portions of the first regions of p-type silicon carbide. N-type impurities are implanted into the first regions of p-type silicon carbide and the epitaxial layer of silicon carbide utilizing the third mask. The oxide layer is patterned on the epitaxial layer, the first regions of n-type silicon carbide and the second regions of n-type silicon carbide to provide a gate oxide.

In still further embodiments of the present invention, the step of growing an epitaxial layer of silicon carbide is provided by growing an undoped epitaxial layer of silicon carbide. In still further embodiments of the present invention, the step of growing an epitaxial layer of silicon carbide is provided by growing an epitaxial layer of silicon carbide having a sheet charge of less than about $10^{13}$ cm$^{-2}$. Furthermore, the epitaxial layer of silicon carbide may be grown to a thickness of from about 0.05 $\mu$m to about 1 $\mu$m. Preferably, the epitaxial layer of silicon carbide is grown to thickness of from about 1000 to about 5000 Å.

In additional embodiments of the present invention, the step of annealing is preceded patterning a fourth mask, the fourth mask being on the layer of n-type silicon carbide and the first regions of p-type silicon carbide and having opening therein corresponding to second regions of p-type silicon carbide disposed in respective ones of the first regions of p-type silicon carbide the second regions of silicon carbide being adjacent the first regions of n-type silicon carbide and opposite the second regions of n-type silicon carbide. P-type impurities are implanted utilizing the fourth mask so that the second regions of p-type silicon carbide have a carrier concentration greater than the carrier concentration of the first regions of silicon carbide. Furthermore, windows may be formed in the epitaxial layer positioned to expose the second regions of p-type silicon carbide First source contacts may also be formed within the window on the second regions of p-type silicon carbide. Second source contacts may be formed on the first source contacts and the first regions of n-type silicon carbide.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. As illustrated in the Figures, the sizes of layers or regions are exaggerated for illustrative purposes and, thus, are provided to illustrate the general structures of the present invention. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 1A:
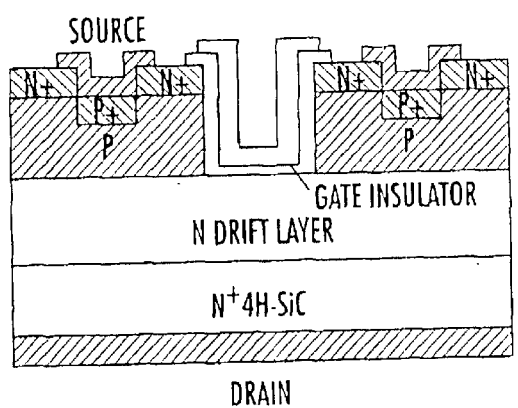
FIG. 1A is an illustration of a conventional UMOSFET.
Figure 1B:
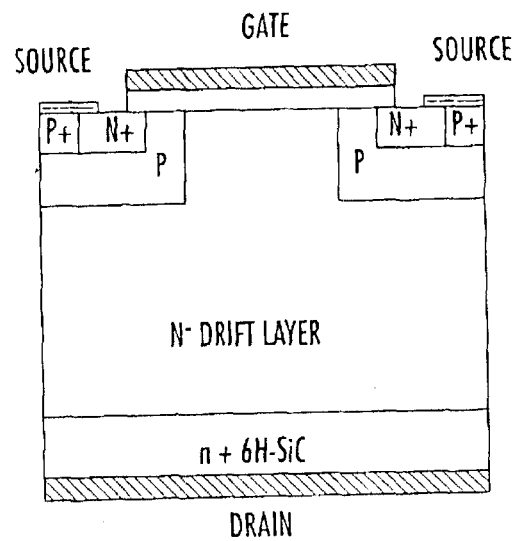
FIG. 1B is an illustration of a conventional DIMOSFET.
Figure 1C:
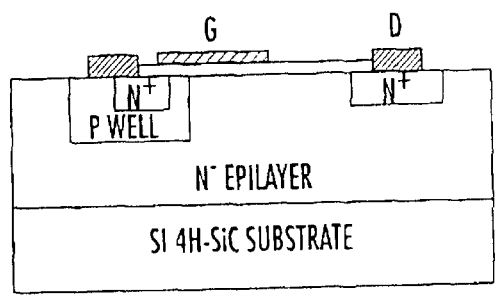
FIGS. 1C and 1D are illustrations of conventional LDMOSTs.
Figure 1D:
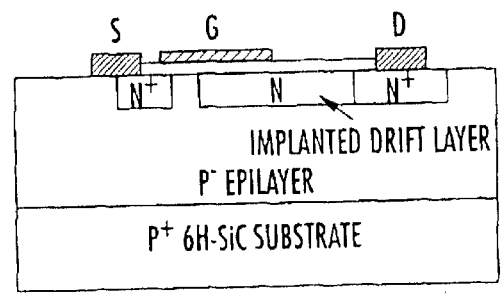
Figure 2:
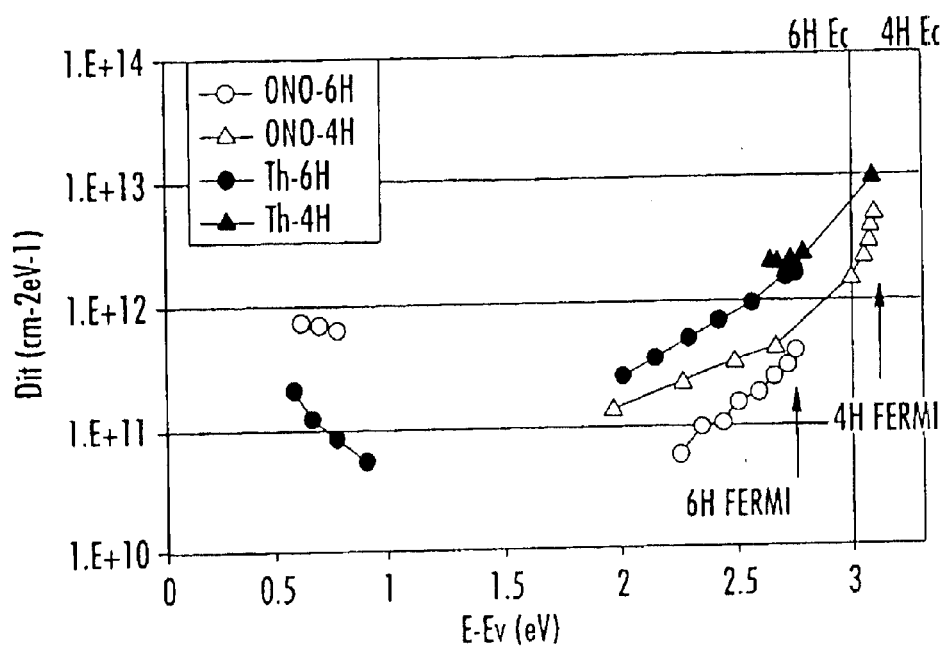
FIG. 2 is a graph of interface trap density versus voltage for ONO and thermally grown oxides on 6H and 4H polytpe silicon carbide.
Figure 3:
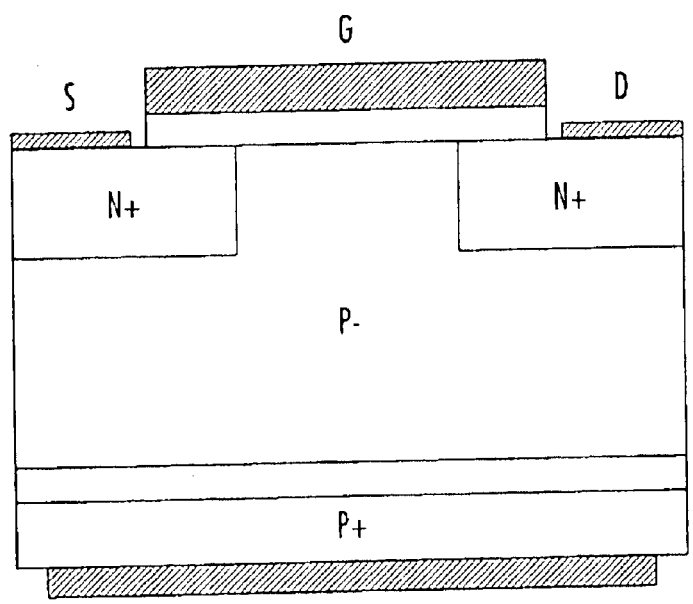
FIG. 3 is a schematic illustration of a conventional planar MOSFET.
Figure 4:
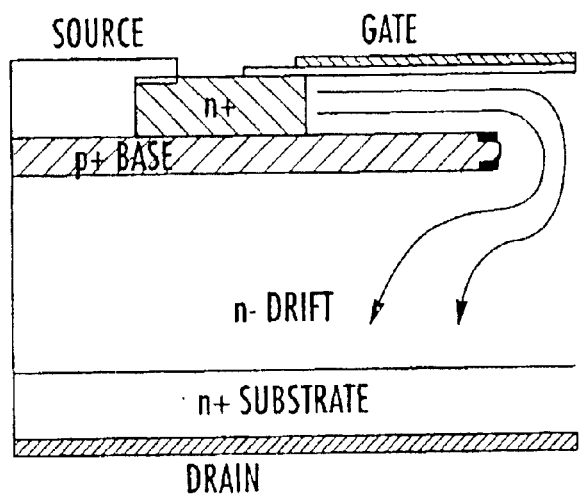
FIG. 4 is a schematic illustration of an n-channel SiC ACCUFET.
Figure 5:
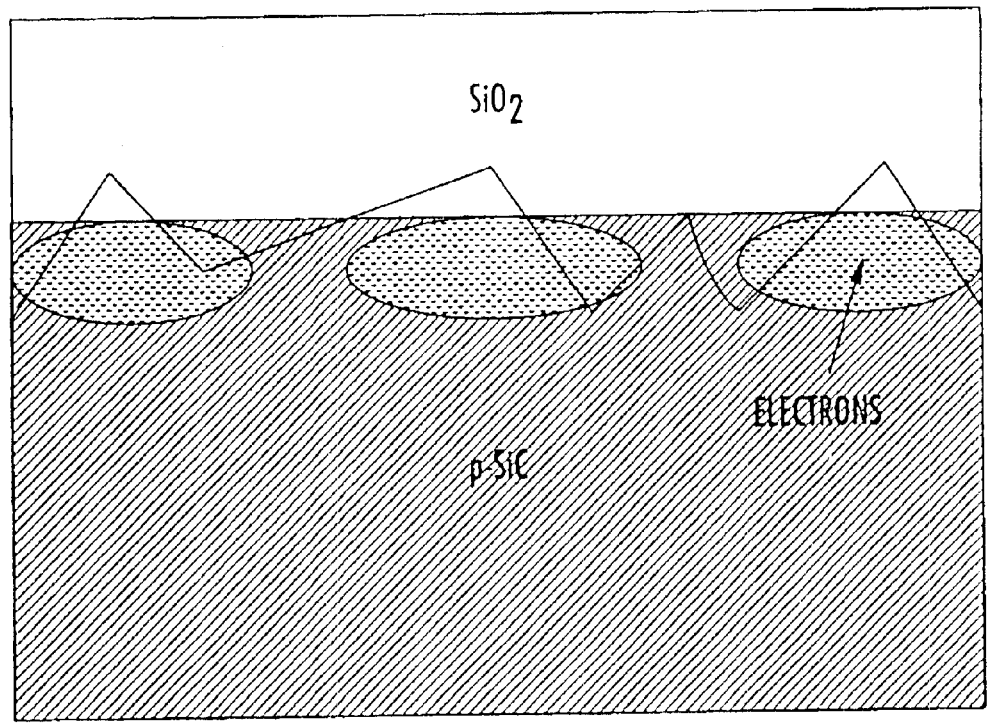
FIG. 5 is a schematic illustration of a rough SiC/SiO$_2$ interface and a discontinuous inversion layer of electrons.

Embodiments of the present invention provide silicon carbide MOSFETs and/or methods of fabricating silicon carbide MOSFETs which may reduce the performance degradation of the device as a result of the interface between SiC and the oxide of the MOSFET. As is clear from the previous discussion, in conventional devices utilizing conventional fabrication techniques, the interface between SiC and SiO$_2$ may be of insufficient quality to provide high surface mobility of electrons in 4H—SiC. While the inventors do not wish to be bound by any theory of operation, it has been proposed that the reduced electron mobility may be due to a high density of interface traps or due to a rough interface resulting in surface potential fluctuations or both. The rough interface is schematically shown in FIG. 5. A high degree of roughness may lead to a discontinuous inversion layer of electrons and hence poor effective mobility. This is especially true when the implanted p-well has been annealed at temperatures in excess of 1500° C.

Figure 6:
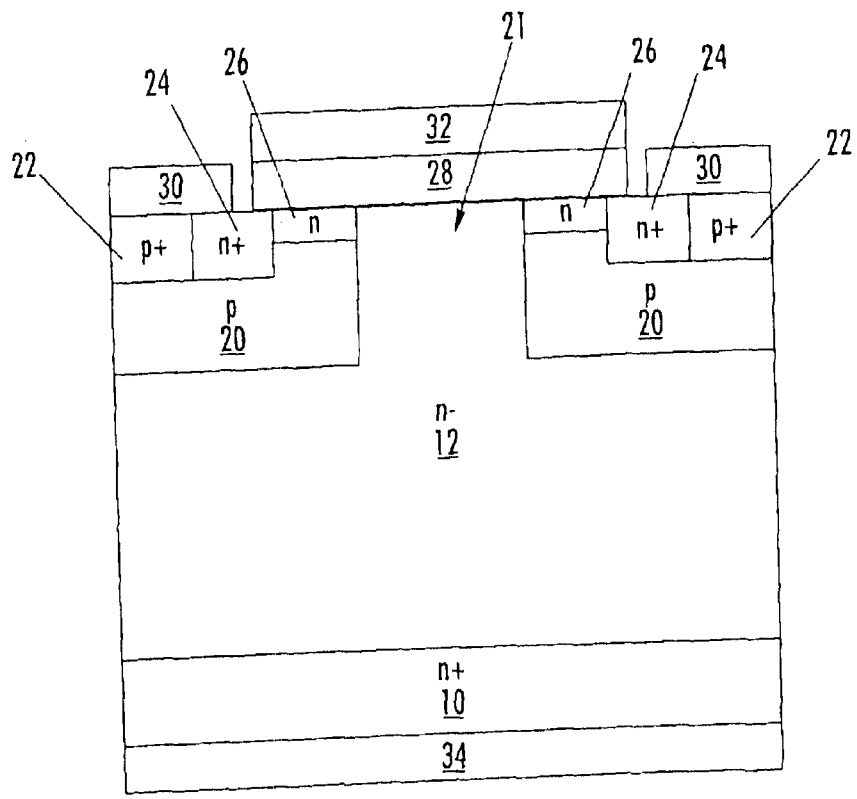
FIG. 6 is a schematic illustration of a SiC MOSFET according to embodiments of the present invention.

MOSFETs according to embodiments of the present invention are illustrated in FIG. 6. As seen in FIG. 6, in particular embodiments of the present invention, a lightly doped n$^-$ drift layer 12 of silicon carbide is on a n$^+$ layer 10 of silicon carbide. The n$^-$ drift layer 12 may be a substrate or an epitaxial layer of silicon carbide and is preferably 4H polytype silicon carbide. Preferably, the n⁻ drift layer 12 has a carrier concentration of from about $10^{14}$ to about $10^{17}$ cm⁻³. Furthermore, the n⁺ layer 10 may be an implanted layer or region or an epitaxial layer. The n⁺ layer preferably has a carrier concentration of from about $10^{18}$ to about $10^{21}$ cm⁻³.

As is further seen in FIG. 6, spaced apart regions of p-type silicon carbide provide p-wells 20 in the n⁻ drift layer 12. The p-wells 20 are, preferably, implanted with Al and annealed at a temperature of at least about 1500° C. The p-wells 20 may have carrier concentrations of from about $1 \times 10^{16}$ to about $2 \times 10^{19}$ cm⁻³ and may extend into the n⁻ drift layer 12 from about 0.1 μm to about 3 μm. While various p-type dopants may be utilized, Al is preferred over Boron as the dopant of the p-wells 20 because Boron tends to diffuse over several microns when annealed at temperatures exceeding 1500° C. Therefore, it may be difficult to control the precise gap between the p-wells 20 (the region which may be referred to as the JFET region 21). If this gap is too high, the field in the gate oxide can become too high when the device is in the blocking state. However, if the gap is too narrow, the resistance of the JFET region 21 may become very high. Accordingly, gaps of from about 1 μm to about 10 μm are preferred. The particular gap utilized for a given device may depend upon the desired blocking voltage and on-state resistance of the device.

Regions of n⁺ silicon carbide 24 and, optionally, regions of p⁺ silicon carbide 22 are disposed within the p-wells 20. The regions of n⁺ silicon carbide 24 are preferably spaced from about 0.5 μm to about 5 μm from the edge of the p-wells 20 adjacent the JFET region 21. The optional regions of p⁺ silicon carbide 22 are preferably adjacent the regions of n⁺ silicon carbide 24 and opposite the edge of the p-wells 20. A thin layer of n-type silicon carbide, such as a layer doped with an n-type impurity such as nitrogen or phosphorus with a preselected dose, extends from the regions of n⁺ silicon carbide 24 to the JFET region of the n⁻ drift layer 12 adjacent the gate oxide 28 to provide shorting channels 26. The shorting channels 26 may be implanted within the p-well and activated at a temperature of at least about 1500° C. along with the p-well activation. Preferably, the shorting channels 26 extend into the p-wells 20 to a depth of from about 0.05 μm to about 1 μm. The doping of the shorting channels 26 may depend on the depth of the layer, the work function of the material for the gate contact 32 and the doping of the p-wells 20 as described below with reference to FIGS. 10A through 10C. However, in general, the shorting channels 26 may have a sheet charge of less than about $10^{13}$ cm⁻². It is also preferable to implant the n-type impurity for the shorting channels 26 after implanting the Al for the p-wells 20 using the same mask to avoid having to realign the mask such that the shorting channels 26 are self-aligned with the p-wells 20. As described above, it is preferred that the shorting channels 26 not extend into the JFET region because extending such layers into the JFET region may increase the electric field in the oxide when the device is in the blocking state.

The gate oxide 28 extends at least between the n⁺ regions of silicon carbide 24 and is preferably either a thermally grown oxide with an NO or $N_2O$ anneal or Oxide/Nitride/Oxide (ONO) where the first oxide is a thermal oxide followed by an NO or $N_2O$ anneal. The gate contact material may be any suitable contact material, however, p-type polysilicon may be preferred because of its high work function. The thickness of the gate oxide 28 may depend on the work function of the material of the gate contact 32. However, in general, thicknesses of from about 100 Å to about 5000 Å are preferred.

One or more source contacts 30 and a drain contact 34 are also provided. Source contacts 30, are preferably formed of nickel (Ni) and may be annealed at temperatures of from about 600° C. to about 1000° C., for example, 825° C., so as to provide an ohmic contact to both the p⁺ regions 22 and the n⁺ regions 24. The drain contact 34 may also be Ni or other such suitable material for forming an ohmic contact to n-type silicon carbide.

Figure 7:
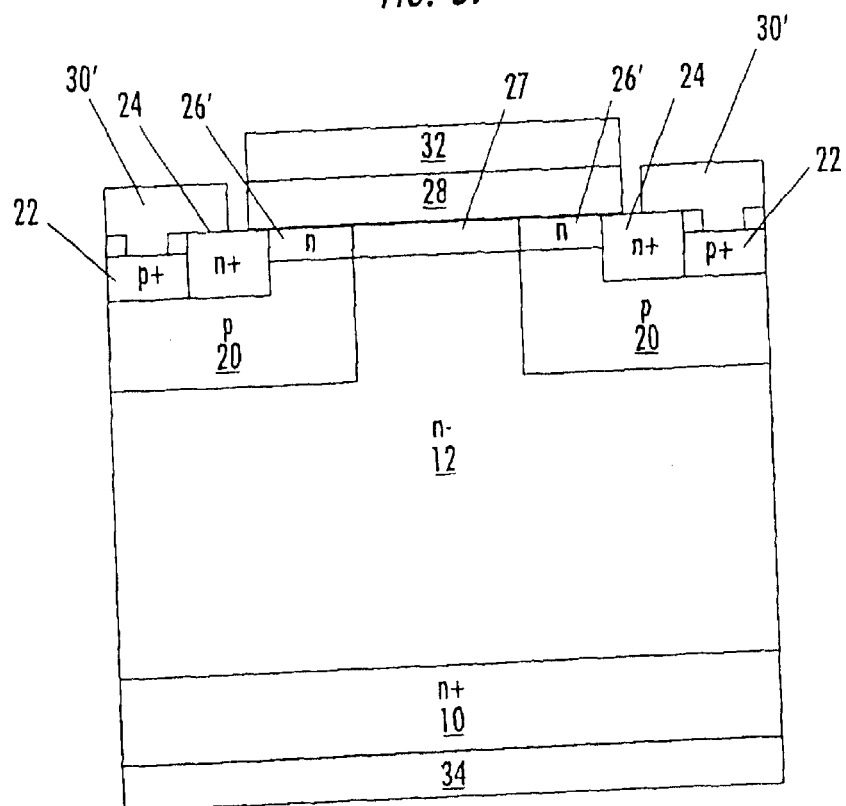
FIG. 7 is a schematic illustration of a SiC MOSFET according to further embodiments of the present invention.

FIG. 7 illustrates further alternative embodiments of the present invention which utilize a regrown epitaxial layer. As seen in FIG. 7, a thin layer of silicon carbide 27 is re-grown on the p-wells 20 after implanting and annealing the p-wells and extends across the n-drift layer 12 in the JFET region. The shorting channels 26' may be formed of the regrown epitaxial layer or, preferably, they may be formed by implantation in and/or through the regrown silicon carbide layer 27. Similarly, the n⁺ regions of silicon carbide 24 may also be formed through the regrown silicon carbide layer 27. The regrown silicon carbide layer 27 may have a thickness of from about 0.05 μm to about 1 μm, however, thicknesses of from about 1000 to about 5000 Å may be preferred. Preferably, the regrown silicon carbide layer 27 is undoped, not intentionally doped or lightly doped. However, if the regrown silicon carbide layer 27 forms the shorting channels 26', the regrown silicon carbide layer 27 should be n-type silicon carbide. Thus, the regrown silicon carbide layer 27 preferably has a sheet charge of less than about $10^{13}$ cm⁻² if the regrown silicon carbide layer 27 provides the shorting channels. For example, a 3500 Å thick silicon carbide layer 27 with a carrier concentration of $2 \times 10^{16}$ may be particularly well suited to provide a device which is normally off at zero gate bias. Such regrowth may reduce the surface roughness created by the implant activation anneal. Moreover, regrowth puts the channel region on an epitaxial layer which may have reduced damage which may enable even higher channel mobility.

As is further seen in FIG. 7, because of the regrown silicon carbide layer 27, a contact window is provided through the silicon carbide layer 27 to provide a contact 30' to the optional p⁺ regions 22 or to the p-wells 20 if the p⁺ regions 22 are not present. The contact 30' may be made of any suitable material for forming an ohmic contact to p-type silicon carbide, however, nickel is preferred.

While FIGS. 6 and 7 illustrate embodiments of the present invention as discrete devices, as will be appreciated by those of skill in the art, FIGS. 6 and 7 may be considered unit cells of devices having multiple cells. Thus, for example, additional unit cells may be incorporated into the devices illustrated in FIGS. 6 and 7 by dividing the device along its central axis (illustrated as the vertical axis in FIGS. 6 and 7) and rotating the divided device about an axis of the periphery of the devices illustrated in FIGS. 6 and 7 (the vertical edges of the devices illustrated in FIGS. 6 and 7). Accordingly, embodiments of the present invention include devices such as those illustrated in FIGS. 6 and 7 as well as devices having a plurality of unit cells incorporating shorting channels illustrated in FIGS. 6 and 7.

Figure 8A:
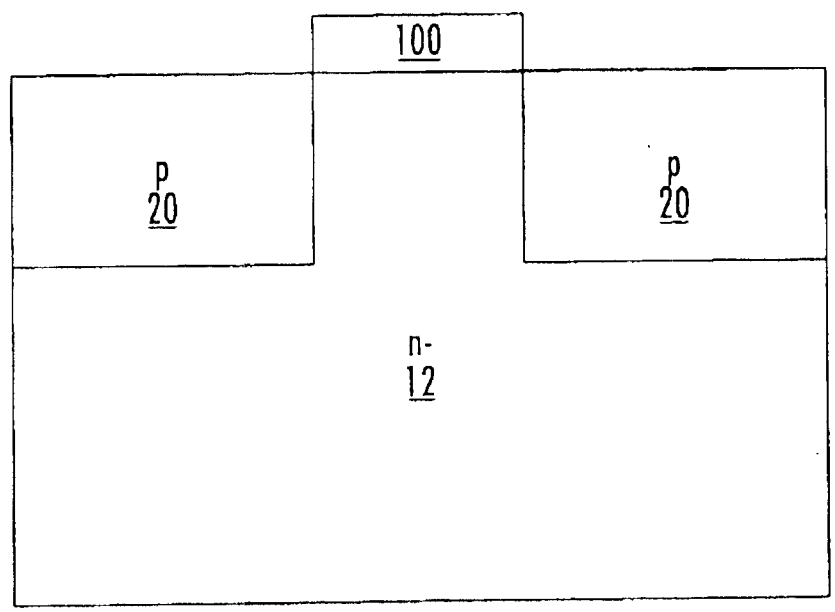
FIGS. 8A through 8H illustrate processing steps in the fabrication of MOSFETS according to various embodiments of the present invention.
Figure 8B:
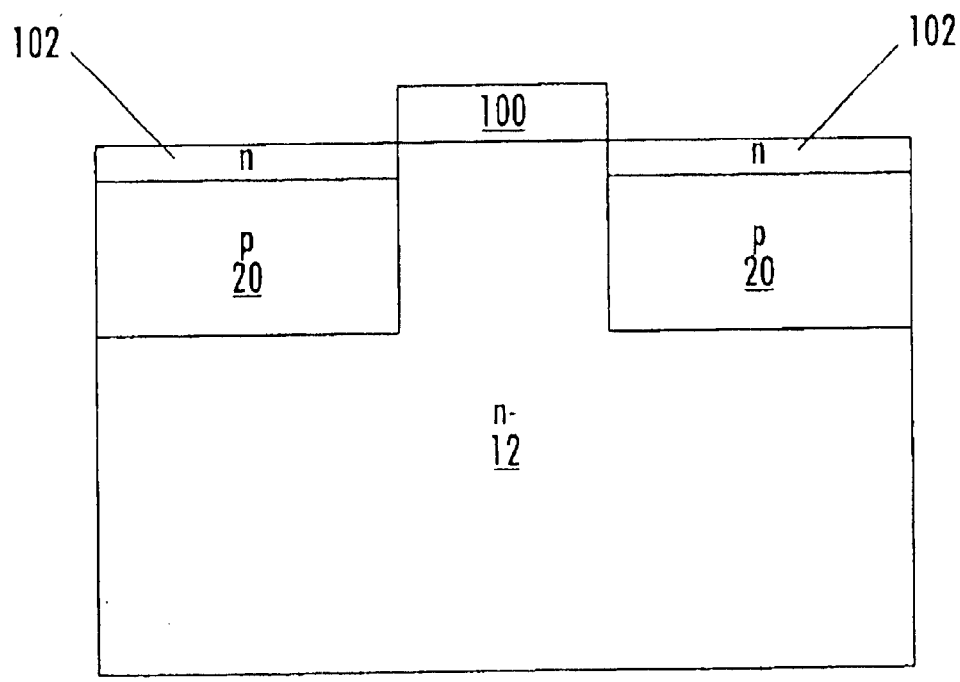
Figure 11:
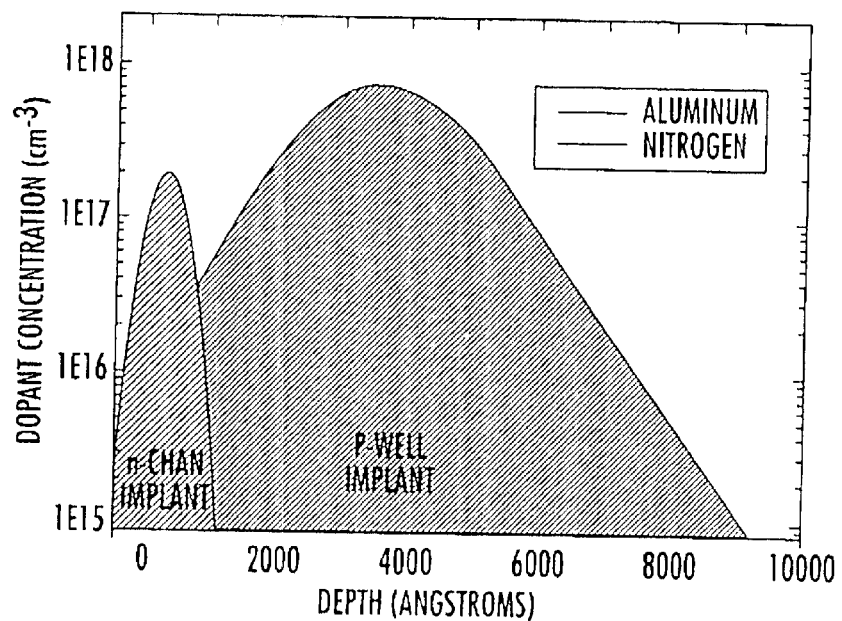
FIG. 11 is a graph of an exemplary doping profile suitable for use in embodiments of the present invention.

Fabrication of devices according to embodiments of the present invention will now be described with reference to FIGS. 8A through 8H and 9A through 9J. As seen in FIG. 8A, a mask 100 is formed and patterned on the n-type layer 12 and impurities implanted into the n-type layer 12 to provide the p-wells 20. Preferably, the impurities are Al implanted to the depths described above and to provide the desired carrier concentrations when activated. After formation of the p-wells 20, an n-type implant 102 is performed utilizing the mask 100, see FIG. 8B. Suitable impurities for implantation of the n-type layer include nitrogen and phosphorous. Such impurities are implanted to provide the shorting channel depth and carrier concentrations described herein. An example of one suitable composite doping profile of the p-wells 20 and the n-type implant 102 is seen in FIG. 11. After implantation of both the p-wells and the n-type layer 102, the resulting structure is heated to a temperature of at least about 1500° C. and maintained at that temperature for a time of from about 30 seconds to about 60 minutes to activate the implanted impurities. Alternatively, such anneal may be carried out after implanting the $n^+$ regions 24, the $p^+$ regions 22 and the backside implant as seen in FIG. 8E.

Figure 8C:
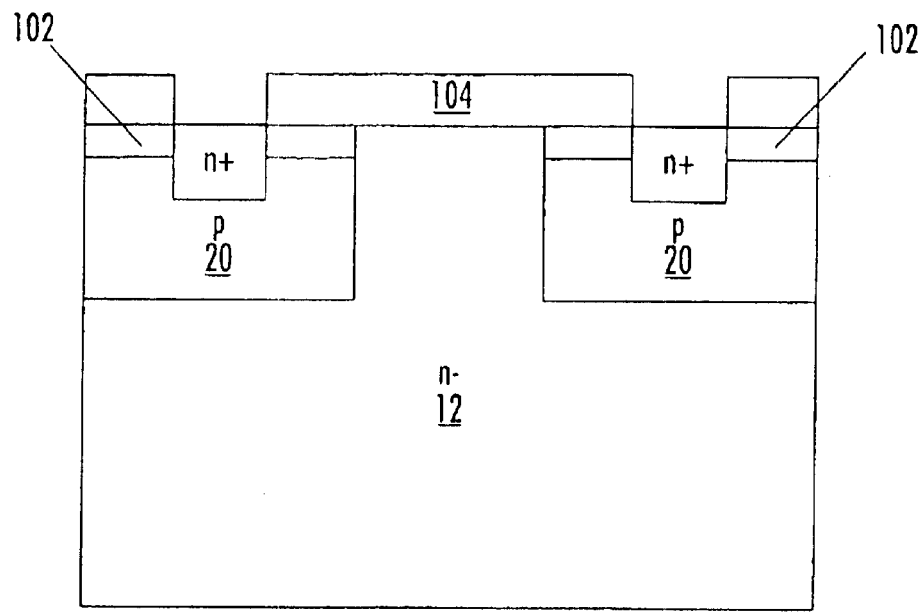

As is seen in FIG. 8C, the mask 100 is removed and a mask 104 is formed and patterned and n-type impurities are implanted utilizing the mask 104 to provide the $n^+$ regions 24. The mask 104 is formed to provide the desired spacing between the periphery of the p-wells 20 and the $n^+$ regions 24 which defines the channel length of the shorting channels 26. Suitable n-type impurities include nitrogen and phosphorous. Furthermore, the impurities may be implanted to provide the dimensions and carrier concentrations of the $n^+$ regions 24 described herein.

Figure 8D:
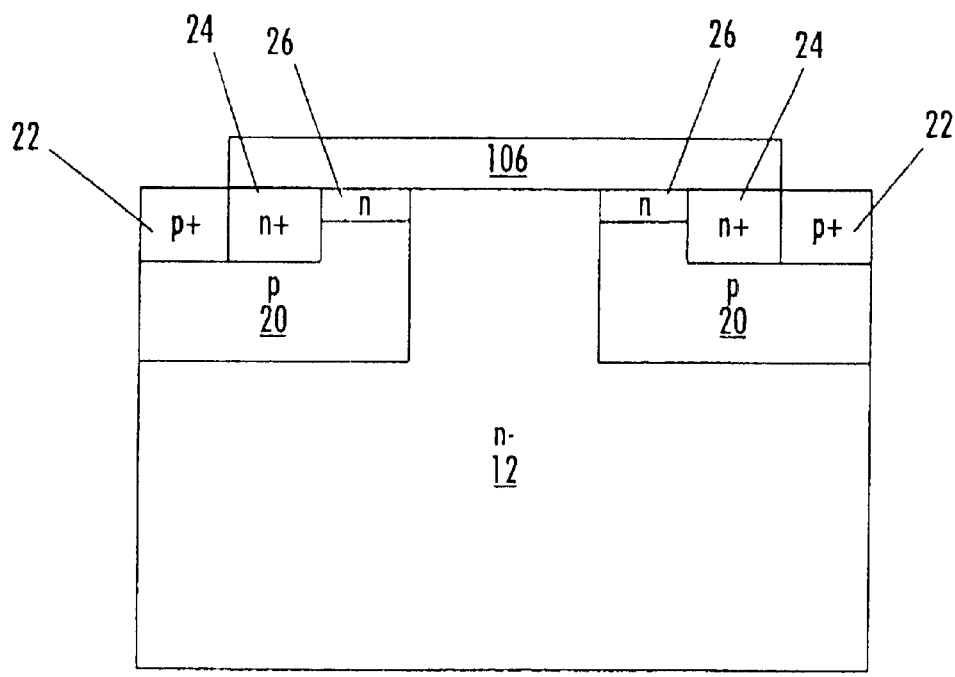

FIG. 8D illustrates the formation of the optional $p^+$ regions. The mask 104 is also removed and a mask 106 formed and patterned and p-type impurities implanted utilizing the mask 106 to provide the $p^+$ regions 22. The p-type impurities may be implanted to provide the dimensions and carrier concentrations of the $p^+$ regions 22 described herein. Preferably, the p-type impurity is aluminum, however, other suitable p-type impurities may also be utilized.

Figure 8E:
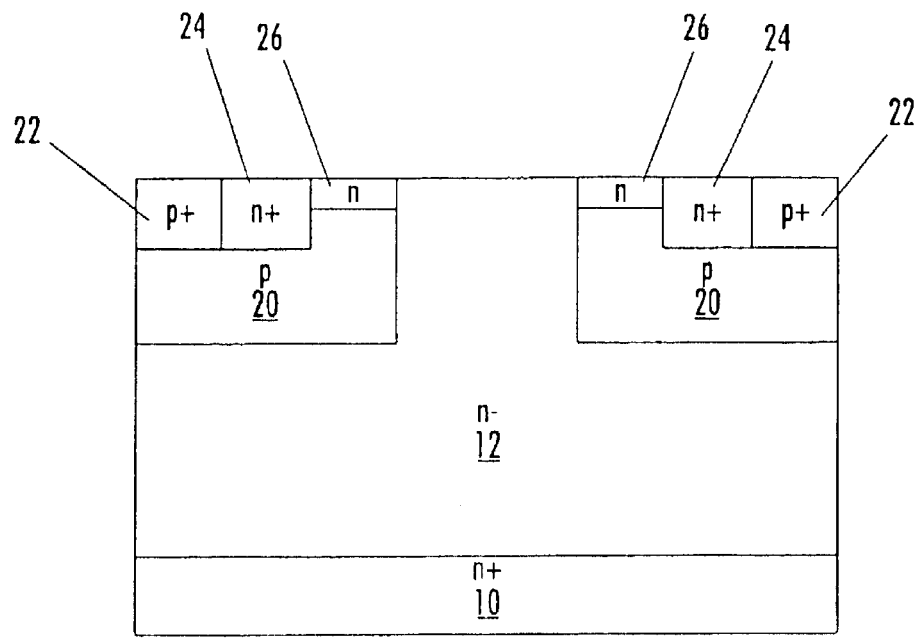

FIG. 8E illustrates the removal of the mask 106 as well as the creation of the $n^+$ layer 10, which may be formed by a backside implant of n-type impurities in a substrate or may be an epitaxial layer and may be formed prior to FIG. 8A. Optionally, the anneal of the structure described above may be performed to activate the implanted p-type and n-type impurities. Alternatively, in embodiments where the gate oxide is annealed after formation to improve the $SiC/SiO_2$ interface, the activation of such impurities may be provided by such anneal.

Figure 8F:
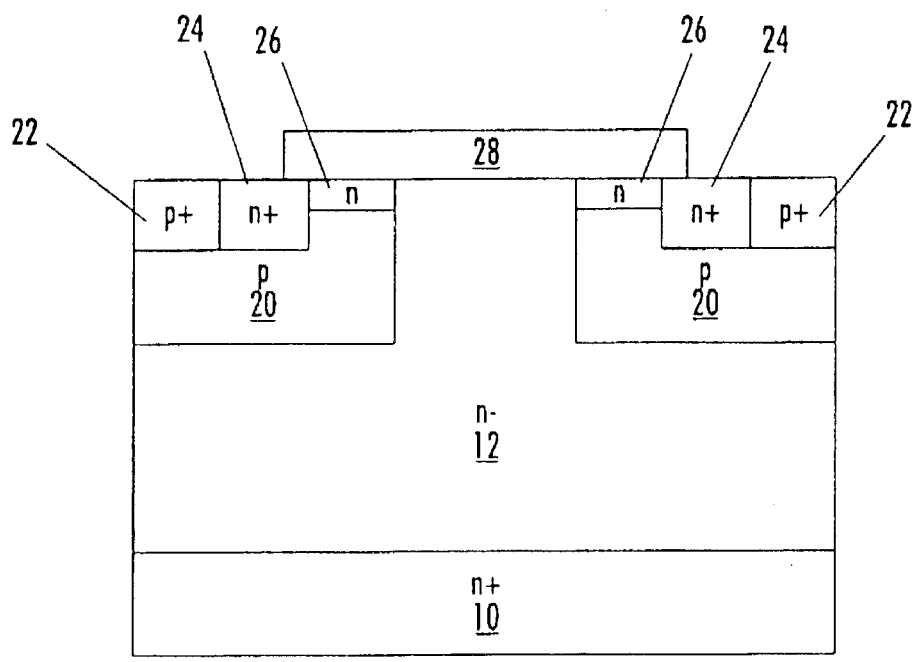

FIG. 8F illustrates the formation and patterning of the gate oxide 28. The gate oxide is preferably thermally grown and is a nitrided oxide. The nitrided oxide may be any suitable gate oxide, however, $SiO_2$, oxynitride or ONO may be preferred. Formation of the gate oxide or the initial oxide of an ONO gate dielectric is preferably followed by an anneal in $N_2O$ or NO so as to reduce defect density at the SiC/oxide interface. In particular embodiments, the gate oxide is formed either by thermal growth or deposition and then annealed in an $N_2O$ environment at a temperature of greater than about 1100° C. and flow rates of from about 2 to about 8 SLM which may provide initial residence times of the $N_2O$ of from about 11 to about 45 seconds. Such formation and annealing of an oxide layer on silicon carbide are described in commonly assigned U.S. patent application Ser. No. 09/834,283, entitled "Method of $N_2O$ Annealing an Oxide Layer on a Silicon Carbide Layer" or as described in U.S. Provisional Application Ser. No. 60/294,302 entitled "Method of $N_2O$ Growth of an oxide layer on a Silicon Carbide Layer" filed May 30, 2001, the disclosures of which are incorporated herein by reference as if set forth fully herein. Additionally, an $N_2O$ grown oxide may also be utilized as described in J. P. Xu, P. T. Lai, C. L. Chan, B. Li, and Y. C. Cheng, "Improved Performance and Reliability of $N_2O$-Grown Oxynitride on 6H—SiC," IEEE Electron Device Letters, Vol. 21, No. 6, pp. 298–300, June 2000. Techniques as described in L. A. Lipkin and J. W. Palmour, "Low interface state density oxides on p-type SiC," Materials Science Forum Vols. 264–268, pp. 853–856, 1998 may also be utilized. Alternatively, for thermally grown oxides, a subsequent NO anneal of the thermally grown $SiO_2$ layer may be provided to reduce the interface trap density as is described in M. K. Das, L. A. Lipkin, J. W. Palmour, G. Y. Chung, J. R. Williams, K. McDonald, and L. C. Feldman, "High Mobility 4H—SiC Inversion Mode MOSFETs Using Thermally Grown, NO Annealed $SiO_2$," IEEE Device Research Conference, Denver, Colo., Jun. 19–21, 2000; G. Y. Chung, C. C. Tin, J. R. Williams, K. McDonald, R. A. Weller, S. T. Pantelides, L. C. Feldman, M. K. Das, and J. W. Palmour, "Improved Inversion Channel Mobility for 4H—SiC MOSFETs Following High Temperature Anneals in Nitric Oxide," IEEE Electron Device Letters accepted for publication; and G. Y. Chung, C. C. Tin, J. R. Williams, K. McDonald, M. Di Ventra, S. T. Pantelides, L. C. Feldman, and R. A. Weller, "Effect of nitric oxide annealing on the interface trap densities near the band edges in the 4H polytype of silicon carbide," Applied Physics Letters, Vol. 76, No. 13, pp. 1713–1715, March 2000. Oxynitrides may be provided as described in U.S. patent application Ser. No. 09/878,442, entitled "High Voltage, High Temperature Capacitor Structures and Methods of Fabrication" filed Jun. 11, 2001, the disclosure of which is incorporated herein by reference as if set forth fully herein.

As an example of formation of a nitrided oxide layer, a layer of oxide may be provided on a silicon carbide layer by oxidizing the silicon carbide layer in an $N_2O$ environment at a temperature of at least about 1200° C. A predetermined temperature profile and a predetermined flow rate profile of $N_2O$ are provided during the oxidation. The predetermined temperature profile and/or predetermined flow rate profile may be constant or variable and may include ramps to steady state conditions. The predetermined temperature profile and the predetermined flow rate profile may be selected so as to reduce interface states of the oxide/silicon carbide interface with energies near the conduction band of SiC. The predetermined temperature profile may result in an oxidation temperature of greater than about 1200° C. Preferably, the oxidation temperature is about 1300° C. The duration of the oxidation may vary depending on the thickness of the oxide layer desired. Thus, oxidation may be carried out for from about 15 minutes to about 3 hours or longer.

Additionally, the predetermined flow rate profile may include one or more flow rates of from about 2 Standard Liters per Minute (SLM) to about 6 SLM. Preferably, the flow rates are from about 3.5 to about 4 Standard Liters per Minute. Furthermore, formation of the resulting oxide layer may be followed by annealing the oxide layer in Ar or $N_2$. Such an annealing operation in Ar or $N_2$ may be carried out, for example, for about one hour.

The predetermined flow rate profile preferably provides a velocity or velocities of the $N_2O$ of from about 0.37 cm/s to about 1.11 cm/s. In particular, the predetermined flow rate profile preferably provides a velocity or velocities of the $N_2O$ of from about 0.65 cm/s to about 0.74 cm/s. Additionally, a wet reoxidation of the oxide layer may also be performed and/or the $N_2O$ oxidation may be carried out in an environment with a fraction or partial pressure of steam.

Additionally, a layer of oxide may be formed on a silicon carbide layer by forming the oxide layer on the silicon carbide layer in an $N_2O$ environment at a predetermined temperature profile which includes an oxidation temperature of greater than about 1200° C. and at a predetermined flow rate profile for the $N_2O$. The predetermined flow rate profile may be selected to provide an initial residence time of the N$_2$O of at least 11 seconds. Preferably, the initial residence time is from about 11 seconds to about 33 seconds. More preferably, the initial residence time is from about 19 seconds to about 22 seconds. Additionally, a total residence time of the N$_2$O may be from about 28 seconds to about 84 seconds. Preferably, the total residence time is from about 48 seconds to about 56 seconds.

Figure 12:
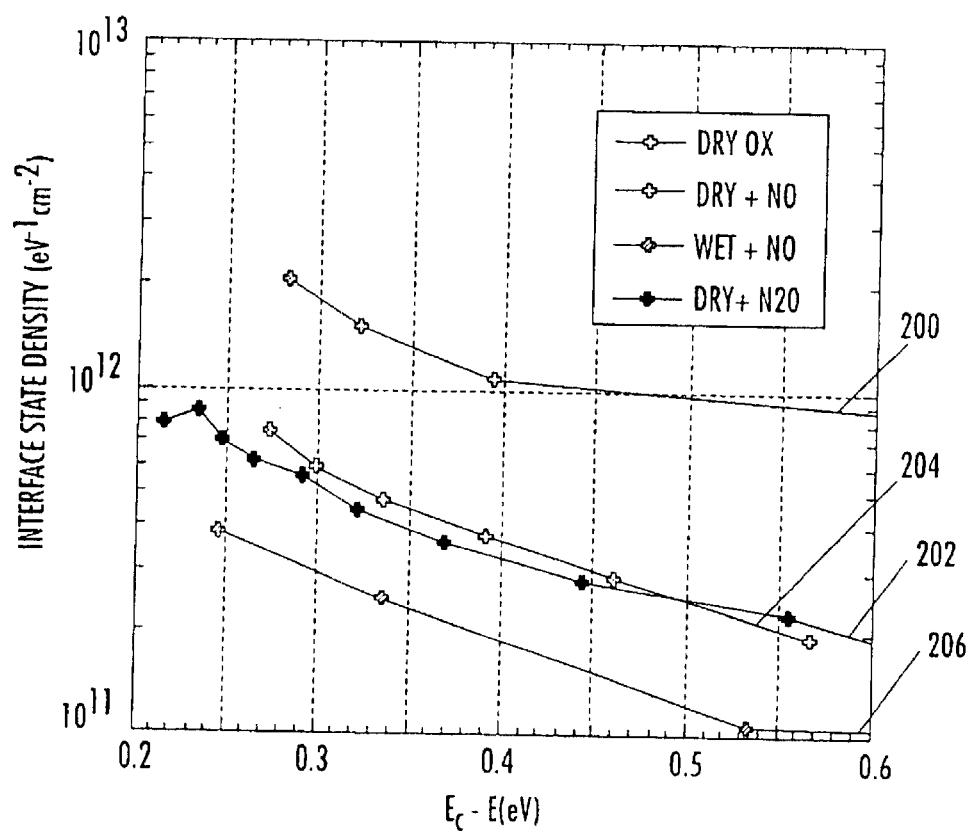
FIG. 12 is a graph of interface trap density (Dit) versus energy level from the conduction band ($E_C$-E) for NO and N$_2$O post oxidation annealing.

A graph of interface state density versus energy level from the conduction band is illustrated in FIG. 12. Line 200 represents an unannealed oxide. Line 202 represents an oxide after a dry anneal in an NO environment. Line 204 represents an oxide after a dry anneal in an N$_2$O environment and line 206 represents an oxide after a wet anneal in an NO environment.

Figure 8G:
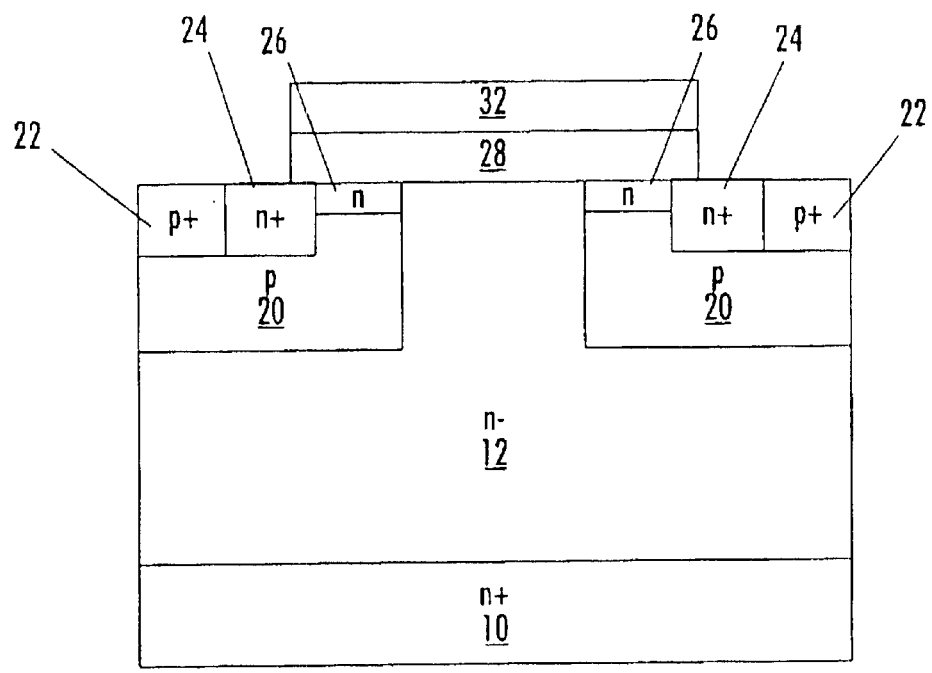
Figure 8H:
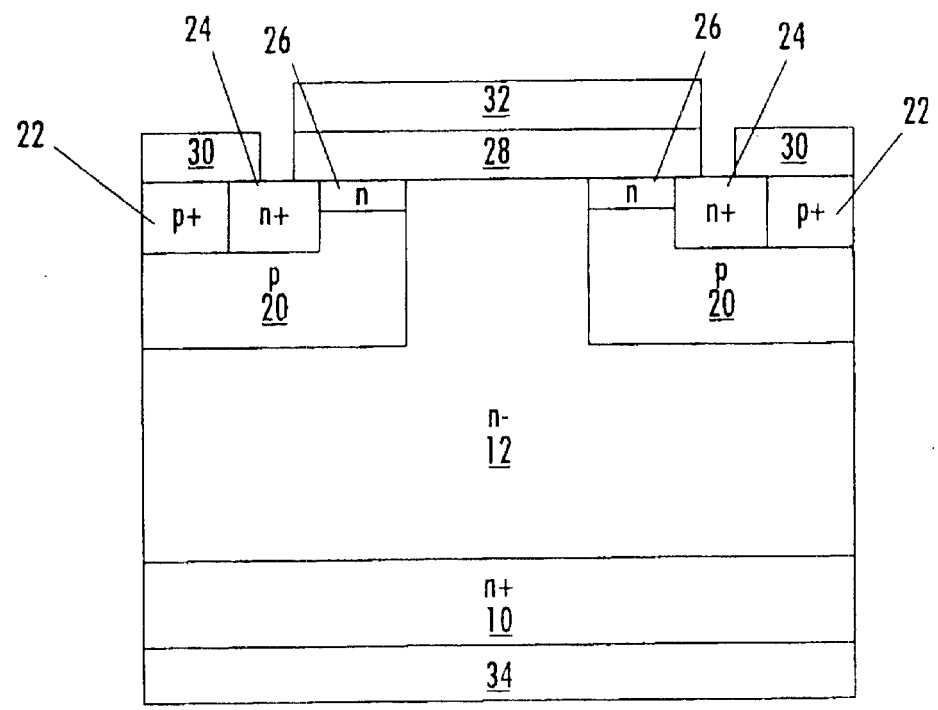

FIG. 8G illustrates formation of the gate contact 32. As described above, the gate contact 32 may be p-type polysilicon or may be other suitable contact material and may be formed and patterned utilizing techniques known to those of skill in the art. Alternatively, the oxide 28 of FIG. 8F and the gate contact 32 may be formed and patterned together. Finally, FIG. 8H illustrates formation of the source and drain contacts 30 and 34 which may be formed by evaporative deposition, sputtering or other such techniques known to those of skill in the art. Preferably, the source and drain contacts 30 and 34 are nickel which is annealed at about 825° C. after formation so as to improve the quality of the ohmic contact.

Figure 9A:
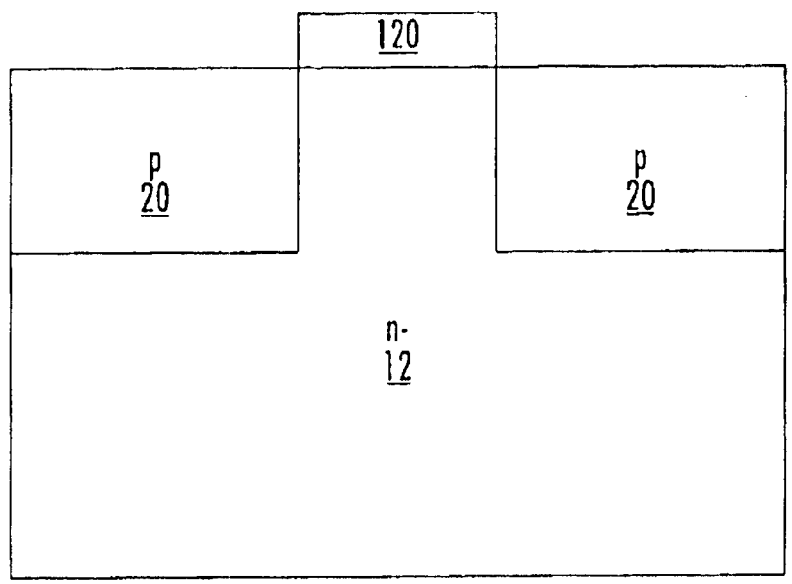
FIGS. 9A through 9J illustrate processing steps in the fabrication of MOSFETS according to further embodiments of the present invention.
Figure 9B:
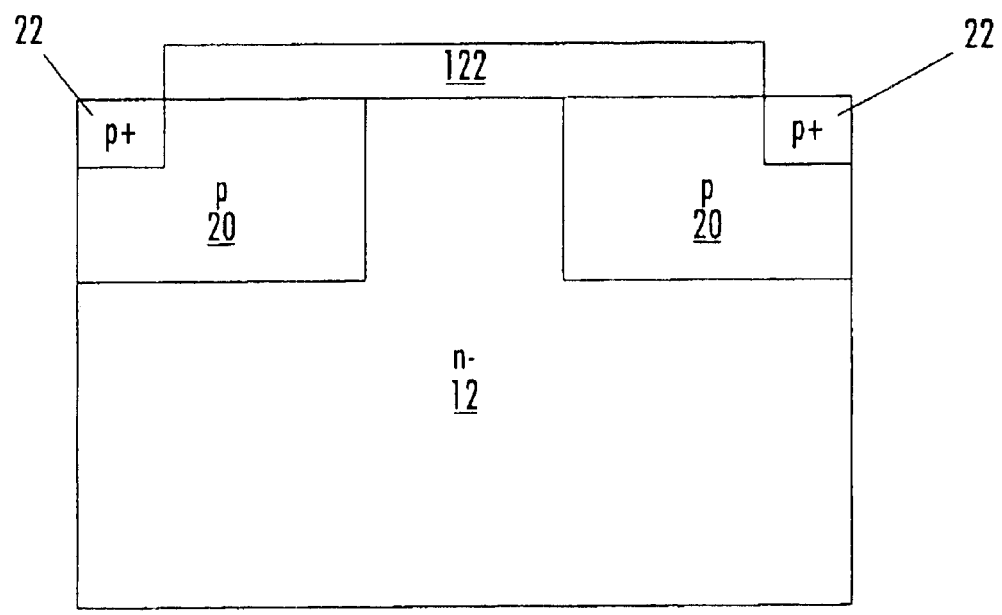

FIGS. 9A through 9J illustrate operations in the fabrication of devices according to alternative embodiments of the present invention utilizing a regrown epitaxial layer. As seen in FIG. 9A, a mask 120 is formed and patterned on the n-type layer 12 and impurities implanted into the n-type layer 12 to provide the p-wells 20. Preferably, the impurities are Al implanted to the depths described above and to provide the desired carrier concentrations when activated. After formation of the p-wells 20, the mask 120 is removed and the mask 122 formed and patterned to correspond to the optional p$^+$ regions 22. A p-type implant is performed utilizing the mask 122, see FIG. 9B. Preferably, the p-type implant implants Al as the p-type impurity. Such impurities are implanted to provide the dimensions and carrier concentrations for the p$^+$ regions 22 described herein. After implantation of both the p-wells 20 and the p$^+$ regions 22, the resulting structure is heated to a temperature of at least about 1500° C. and maintained at that temperature for a time of from about 30 seconds to about 60 minutes to activate the implanted impurities.

Figure 9C:
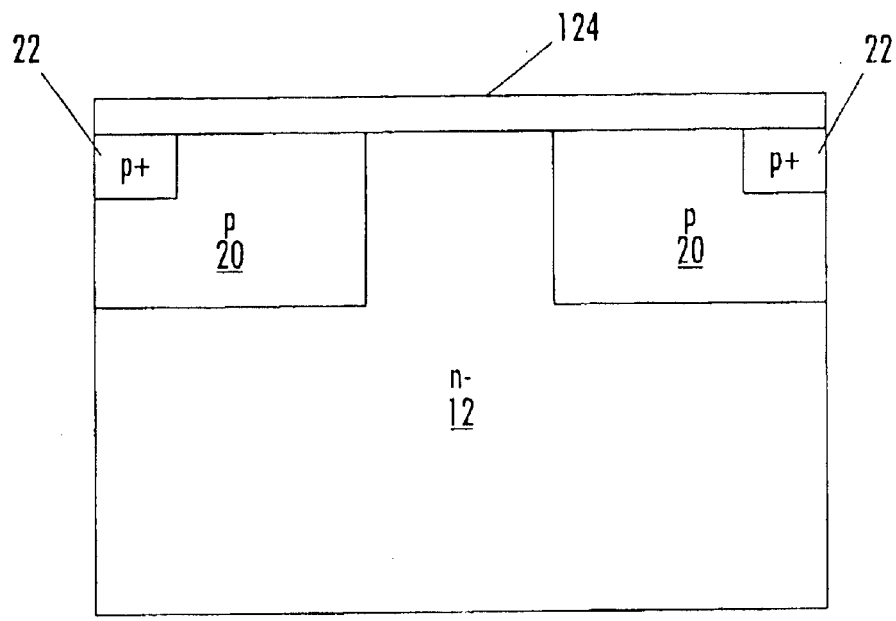

As is seen in FIG. 9C, the mask 122 is removed and an epitaxial layer 124 of SiC is formed on the p$^+$ regions 22, the p-wells 20 and the n-type silicon carbide layer 12 utilizing conventional techniques for growing silicon carbide epitaxial layers. As described above, the regrown epitaxial layer 124 is preferably undoped silicon carbide but may also be lightly doped silicon carbide.

Figure 9D:
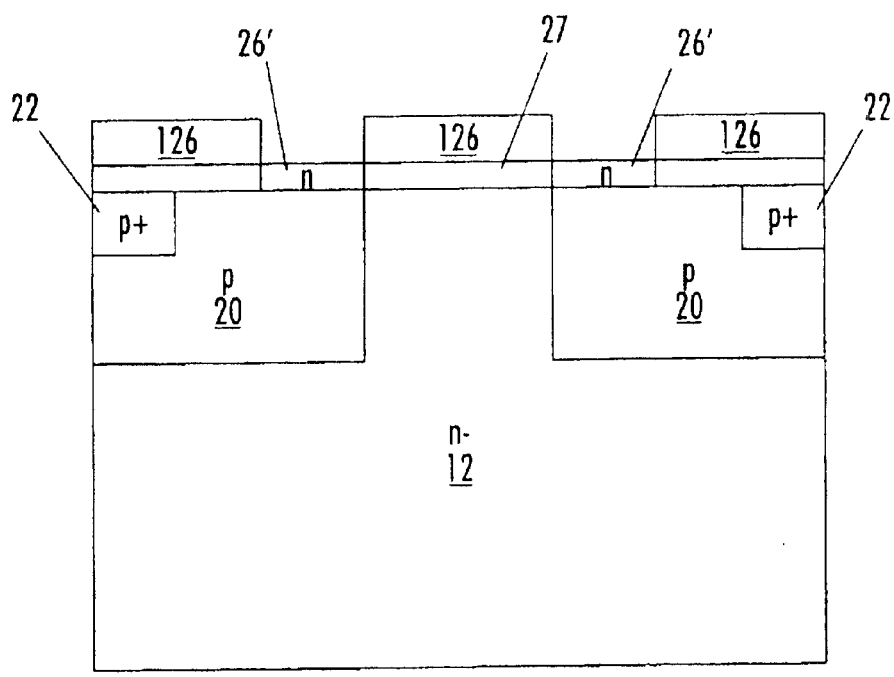

FIG. 9D illustrates the optional implantation of n-type impurities to provide the shorting channels 26'. As seen in FIG. 9D, a mask 126 is formed and patterned and n-type impurities implanted utilizing the mask 126 to provide the shorting channels 26'. The mask 126 is formed to provide the desired location of the shorting channels, preferably, so that the shorting channels do not extend substantially into the JFET region of the device. Suitable n-type impurities include nitrogen and phosphorous. Preferably, the impurities are implanted to provide the dimensions and carrier concentrations of the shorting channels 26' described herein.

Figure 9E:
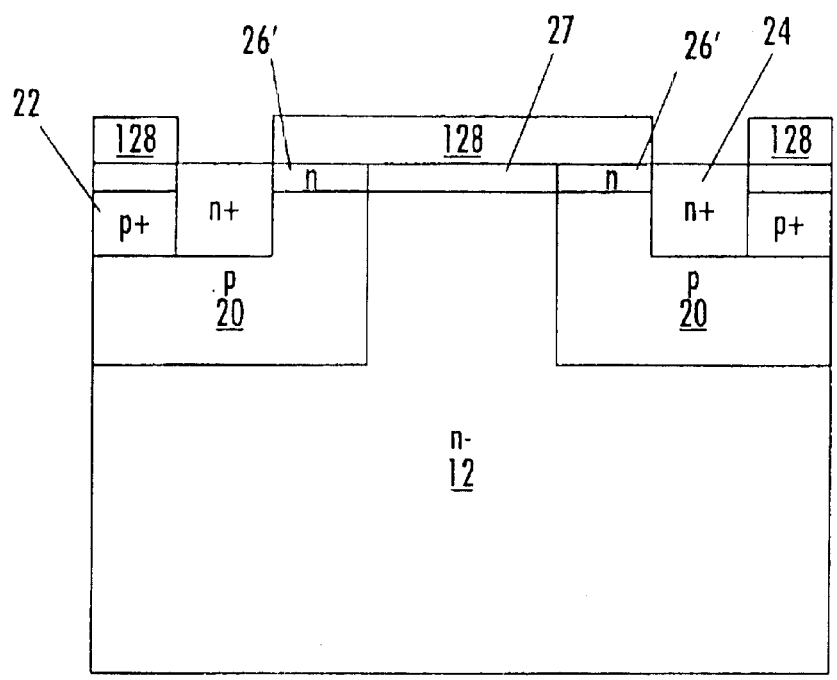

FIG. 9E illustrates formation of the n$^+$ regions 24. As seen in FIG. 9E, the mask 126 has been removed and a mask 128 formed and patterned to provide openings corresponding to the n$^+$ regions 24. The mask 128 is used to implant n-type impurities so as to provide the dimensions and carrier concentrations described herein for the n$^+$ regions 24.

Figure 9F:
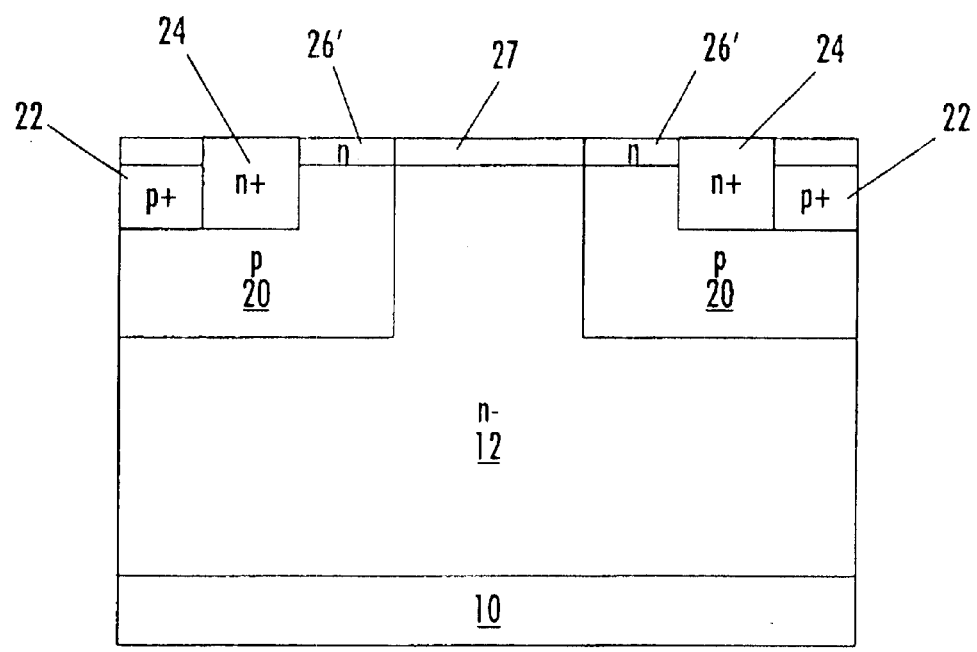

FIG. 9F illustrates the removal of the mask 128 as well as the creation of the n$^+$ layer 10, which may be formed by a backside implant of n-type impurities in a substrate or may be an epitaxial layer and may be formed prior to FIG. 9A. Optionally, an anneal of the structure, preferably at temperatures of less than 1500° C., may be performed to activate the implanted p-type and n-type impurities. Alternatively, in embodiments where the gate oxide is annealed after formation to improve the SiC/SiO$_2$ interface, the activation of such impurities may be provided by such anneal.

Figure 9G:
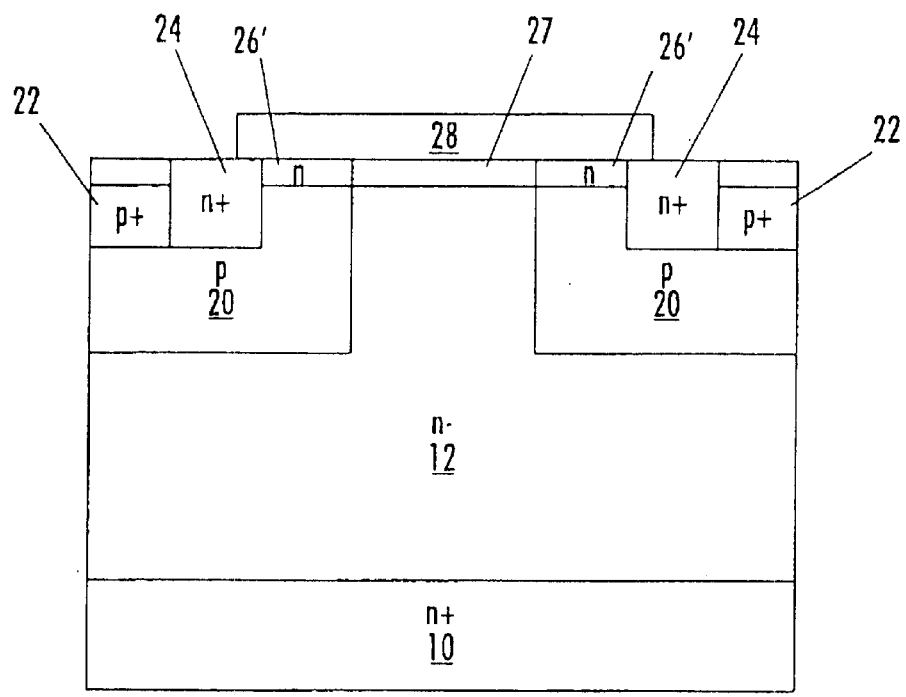

FIG. 9G illustrates the formation and patterning of the gate oxide 28. The gate oxide 28 is preferably thermally grown and is preferably a nitrided oxide. The nitrided oxide may be any suitable gate oxide, however, SiO$_2$, oxynitride or ONO may be preferred. Formation of the gate oxide may be carried out as described above with reference to FIG. 8F.

Figure 9H:
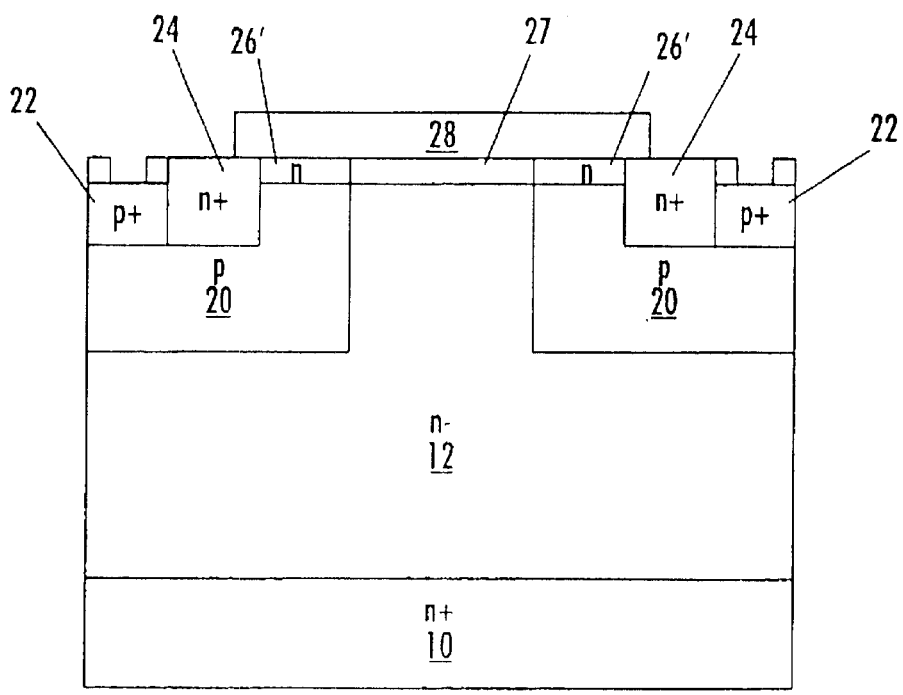
Figure 9I:
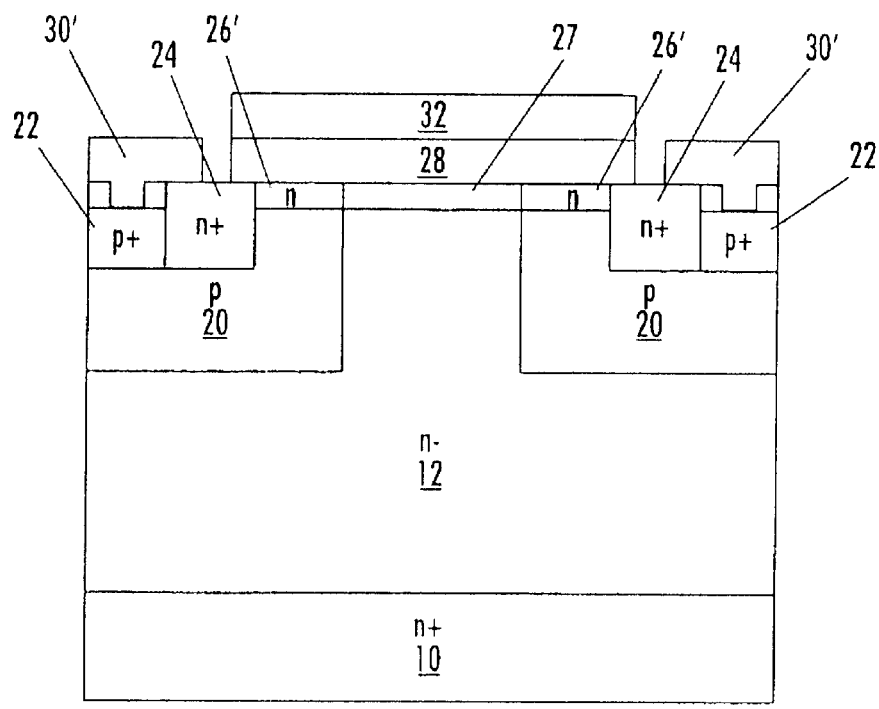
Figure 9J:
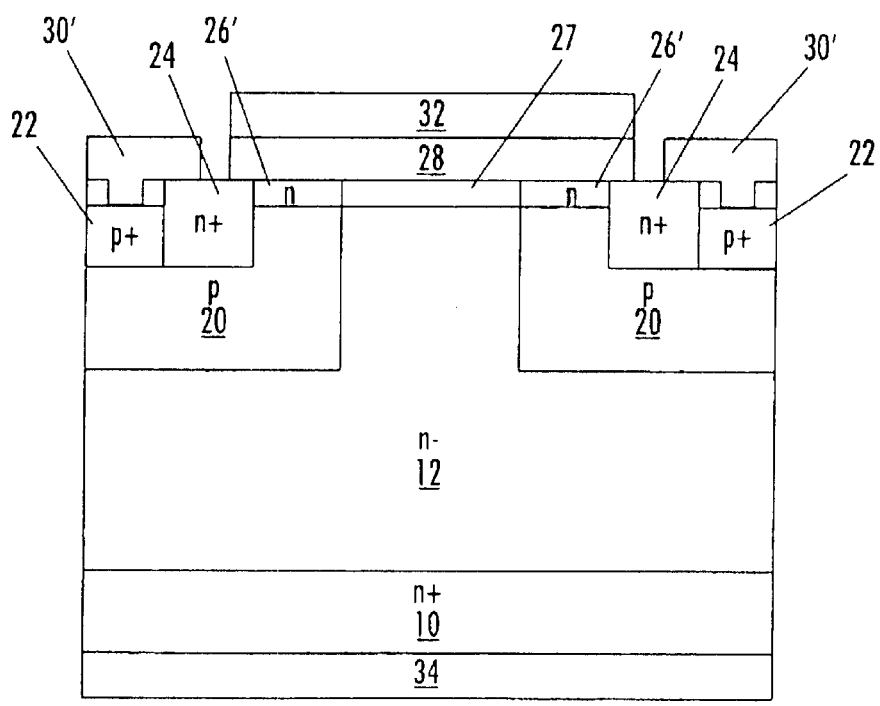

FIG. 9H illustrates formation of source contacts 30'. As seen in FIG. 9H, windows are opened in the regrown layer 124 corresponding to the location of the p$^+$ regions 22. The contacts 30' are then formed in the window. FIG. 9I illustrates formation of the gate contact 32 and the source contacts 30'. Alternatively, the oxide 28 of FIG. 9G and the gate contact 32 may be formed and patterned together. As described above, the gate contact 32 may be p-type polysilicon or may be other suitable contact material and may be formed and patterned utilizing techniques known to those of skill in the art. Source contacts 30' may be formed by evaporative deposition, sputtering or other such techniques known to those of skill in the art. Finally, FIG. 9J illustrates formation of the drain contact 34 which may be formed by evaporative deposition, sputtering or other such techniques known to those of skill in the art. Preferably, the source and drain contacts 30' and 34 are nickel which is annealed at temperature of from about 600° C. to about 1000° C., for example, about 825° C., after formation so as to improve the quality of the ohmic contact.

Figure 10A:
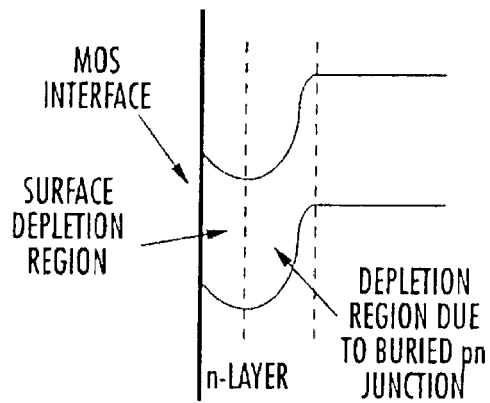
FIGS. 10A through 10C illustrate operation of a shorting channel according to particular embodiments of the present invention.
Figure 10B:
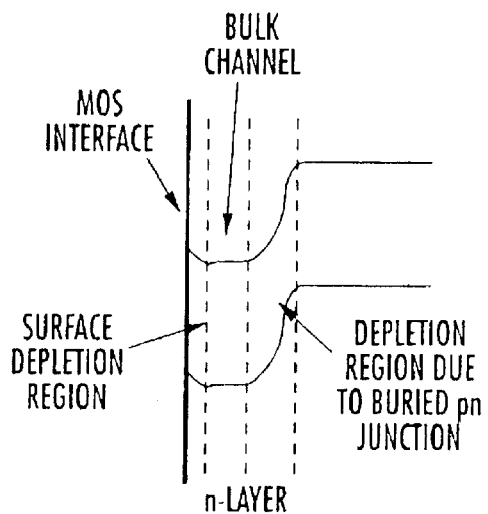
Figure 10C:
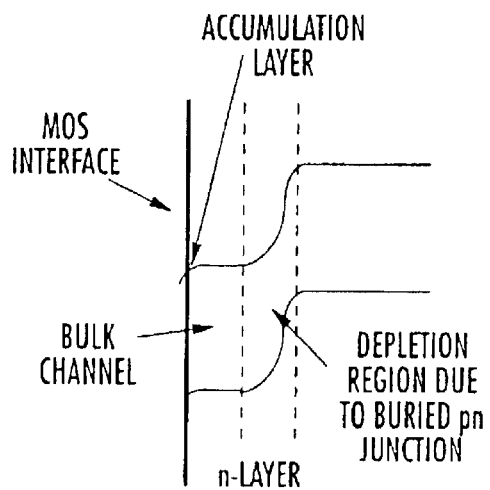

As described above, embodiments of the present invention provide shorting channels 26 and 26' between the JFET region of the device, through the p-wells 20 and to the n$^+$ regions 24. In forming the shorting channels 26 and 26', the dose and energy of the n-type impurity is preferably controlled so as to make the device normally off at zero gate bias. This can be done because there is self-depletion of the shallow n-type layer from the built-in voltage of the pn junction, the work function difference of the gate metal and the SiC, and the net charge in the oxide and the interface states. However, care should be taken so that the n-layer is not completely depleted by the buried pn junction. This ensures the existence of a bulk channel under the thin accumulation layer. The width of this bulk channel increases with positive gate biases until an accumulation layer is formed at the MOS interface, as shown in FIGS. 10A through 10C. This accumulation layer may be discontinuous due to surface roughness and fluctuations of the surface potential.

FIG. 10A illustrates the shorting channels 26 and 26' when no gate bias is applied. As seen in FIG. 10B, the bulk channel, which is created by positive gate bias, connects discontinuous surface accumulation layer regions, resulting in a smooth current path from source to drain of the MOSFET. As illustrated in FIG. 10C, as more gate bias is applied, the bulk channel eventually extends to the accumulation layer.

As briefly mentioned above, to achieve more efficient shorting channels, a gate metal with a high work function (such as p+ polysilicon) and a thinner gate dielectric can be used. The high work function gate metal and thinner gate dielectric can deplete more charge under the MOS gate at zero gate bias, which turns into a bulk channel with more free carriers at a positive gate bias (see FIG. 10A). However, providing shorting channels alone may be insufficient to achieve very high effective channel mobilities because the number of free electrons in the bulk channel is very limited. However, shorting channels in combination with a reduction in surface state density, preferably to less than about $10^{12}$ $ev^{-1}cm^{-2}$ for within about 0.4 eV of the conduction band energy for 4H polytype silicon carbide, to reduce surface scattering of the carriers may provide very high effective channel mobilities.

Figure 13:
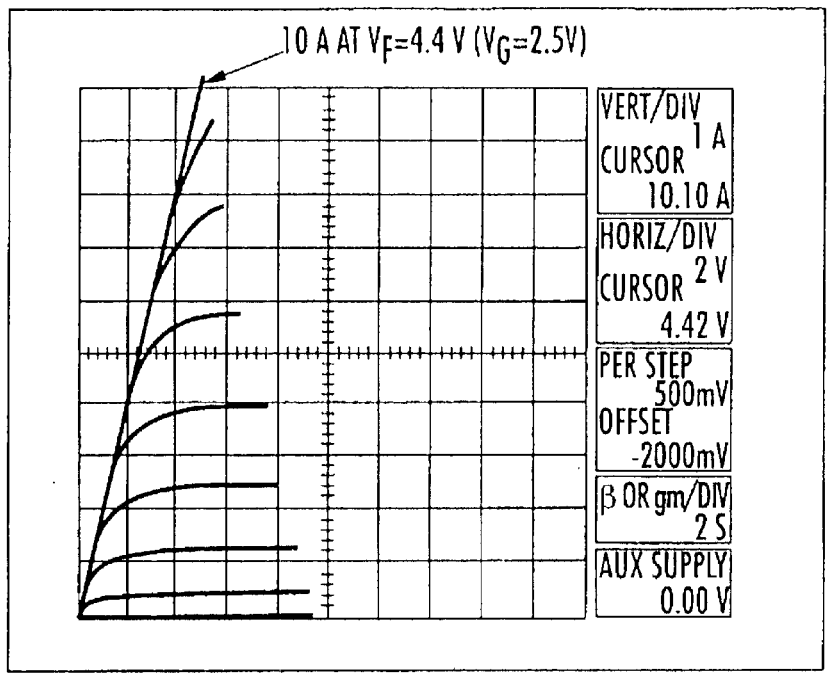
FIG. 13 is graph of the forward I-V characteristics for a device according to embodiments of the present invention.
Figure 14:
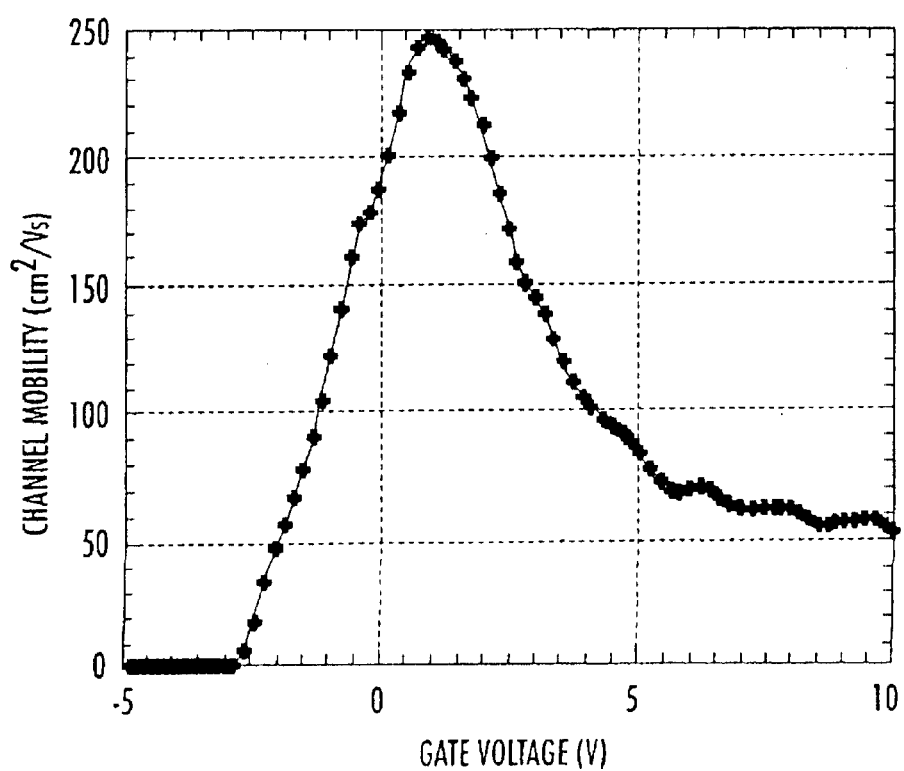
FIG. 14 is a graph of channel mobility versus gate voltage for a device according to embodiments of the present invention.

The on-state I–V characteristics of a device according to embodiments of the present invention are shown in FIG. 13. The device was a 3.3 mm by 3.3 mm 4HSiC power MOSFET. As seen in FIG. 13, 10 A of current is obtained for a 4.4 V forward drop. This device is normally-on at $V_G=0$ V due to the relatively high dose of Nitrogen implanted in the p-well. However, the device can be made normally-off by reducing this dose. The electron mobility vs. gate voltage for a 100 µm by 100 µm MOSFET according to embodiments of the present invention is shown in FIG. 14. In the low field regime, extremely high mobility (approaching bulk value) is obtained due to the buried nature of the channel. At higher gate bias, the mobility reduces due to the channel being confined to the surface. Even so, a high field mobility of ~50 $cm^2/Vs$ is achieved.

While embodiments of the present invention have been described with reference to particular sequences of operations, as will be appreciated by those of skill in the art, certain operations within the sequence may be reordered while still benefiting from the teachings of the present invention. For example, in particular embodiments of the present invention, the formation of the n+ regions 24 and the p+ regions 22 may be reversed. Accordingly, the present invention should not be construed as limited to the exact sequence of operations described herein.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A silicon carbide metal-oxide semiconductor field effect transistor, comprising:
    a double implant silicon carbide MOSFET, having an n-type silicon carbide drift layer, spaced apart p-type silicon carbide regions in the n-type silicon carbide drift layer and having n-type silicon carbide regions therein, and a nitrided oxide layer on the n-type silicon carbide drift layer; and
    n-type shorting channels extending from respective ones of the n-type silicon carbide regions through the p-type silicon carbide regions and to the n-type silicon carbide drift layer, wherein the n-type shorting channels extend to but not into the n-type silicon carbide drift layer and wherein the n-type shorting channels have a higher n-type dopant concentration than is present in a region disposed between the n-type shorting channels.

2. A silicon carbide metal-oxide semiconductor field effect transistor according to claim 1, wherein the p-type silicon carbide regions comprise spaced apart regions of silicon carbide having aluminum implanted therein.

3. A silicon carbide metal-oxide semiconductor field effect transistor according to claim 1, further comprising a gate contact on the oxide layer, the gate contact comprising p-type polysilicon.

4. A silicon carbide metal-oxide semiconductor field effect transistor according to claim 1, wherein the n-type shorting channels are doped so that the n-type channels are self depleted when a zero volt gate bias is applied.

5. A silicon carbide metal-oxide field effect transistor according to claim 1, wherein the shorting channels have a sheet charge of less than about $10^{13}$ $cm^{-2}$.

6. A silicon carbide metal-oxide field effect transistor according to claim 1, wherein the shorting channels have a sheet charge corresponding to a silicon carbide epitaxial layer having a thickness of about 3500 Å and a carrier concentration of about $2\times10^{16}$ $cm^{-3}$.

7. A silicon carbide metal-oxide field effect transistor according to claim 1, wherein the silicon carbide comprises 4H polytype silicon carbide and wherein an interface between the oxide layer and the n-type drift layer has an interface state density of less than $10^{12}$ $eV^{-1}cm^{-2}$ for energy levels between about 0.3 and about 0.4 eV of a conduction band energy of 4H polytype silicon carbide.

8. A silicon carbide metal-oxide field effect transistor according to claim 1, wherein the nitride oxide comprises at least one of an oxide-nitride-oxide structure and an oxynitride.

9. A silicon carbide metal-oxide semiconductor field effect transistor, comprising:
    a double implant silicon carbide MOSFET, having an n-type silicon carbide drift layer, spaced apart p-type silicon carbide regions in the n-type silicon carbide drift layer and having n-type silicon carbide regions therein, and a nitrided oxide layer on the n-type silicon carbide drift layer;
    n-type shorting channels extending from respective ones of the n-type silicon carbide regions through the p-type silicon carbide regions and to the n-type silicon carbide drift layer, the n-type shorting channels extending to but not beyond a periphery of the p-type silicon carbide regions and wherein the n-type shorting channels have a higher n-type dopant concentration than is present in a region disposed between the n-type shorting; and
    an epitaxial layer of silicon carbide on the n-type silicon carbide drift layer between the n-type shorting channels.

10. A silicon carbide device comprising:
    a drift layer of n-type silicon carbide;
    first regions of p-type silicon carbide in the drift layer, the first regions of p-type silicon carbide being spaced apart and having peripheral edges which define a region of the drift layer therebetween;
    first regions of n-type silicon carbide having a carrier concentration greater than a carrier concentration of the drift layer in the first regions of p-type silicon carbide and spaced apart from the peripheral edges of the first regions of p-type silicon carbide;
    second regions of n-type silicon carbide having a carrier concentration less than the carrier concentration of the first regions of n-type silicon carbide and which extend from the first regions of n-type silicon carbide to, but not substantially beyond, the peripheral edges of the first regions of p-type silicon carbide and wherein the second regions of n-type silicon carbide have a higher n-type dopant concentration than is present in a region disposed between the second regions of n-type silicon carbide; and a nitrided oxide layer on the drift layer, the first regions of n-type silicon carbide and the second regions of n-type silicon carbide.

11. A silicon carbide device according to claim 10, wherein the second regions of n-type silicon carbide have a sheet charge of less than about $10^{13}$ cm$^{-2}$.

12. A silicon carbide device according to claim 11, wherein the second regions of n-type silicon carbide have a depth of from about 0.05 µm to about 1 µm.

13. A silicon carbide device according to claim 10, wherein the second regions of n-type silicon carbide have a sheet charge corresponding to a silicon carbide epitaxial layer having a thickness of about 3500 Å and a carrier concentration of about $2\times10^{16}$ cm$^{-3}$.

14. A silicon carbide device according to claim 10, wherein an interface state density of an interface between the oxide layer and the drift layer, the first regions of n-type silicon carbide and the second regions of n-type silicon carbide is less than about $10^{12}$ eV$^{-1}$cm$^{-2}$ between about 0.3 and about 0.4 eV of the conduction band energy of 4H polytype silicon carbide.

15. A silicon carbide device according to claim 10, further comprising second regions of p-type silicon carbide disposed in respective ones of the first regions of p-type silicon carbide, wherein the second regions of p-type silicon carbide have a carrier concentration greater than the carrier concentration of the first regions of silicon carbide, the second regions of silicon carbide being adjacent the first regions of n-type silicon carbide and opposite the second regions of n-type silicon carbide.

16. A silicon carbide device according to claim 10, further comprising a gate contact on the oxide layer.

17. A silicon carbide device according to claim 16, wherein the gate contact is p-type polysilicon.

18. A silicon carbide device according to claim 10, further comprising contacts on the first region of p-type silicon carbide and the first region of n-type silicon carbide.

19. A silicon carbide device according to claim 10, further comprising:

a layer of n-type silicon carbide having a carrier concentration greater than the carrier concentration of the drift layer and disposed adjacent the drift layer opposite the oxide layer; and a drain contact on the layer of n-type silicon carbide.

20. A silicon carbide metal-oxide field effect transistor according to claim 10, wherein the nitride oxide layer comprises at least one of an oxide-nitride-oxide structure and an oxynitride layer.

21. A silicon carbide device according to claim 10, further comprising an epitaxial layer of silicon carbide on the first p-type regions and the drift layer of n-type silicon carbide, wherein the second regions of n-type silicon carbide extend into the epitaxial layer, the first regions of n-type silicon carbide extend through the epitaxial layer and the oxide layer is on the epitaxial layer, the first regions of n-type silicon carbide and the second regions of n-type silicon carbide.

22. A silicon carbide device according to claim 21, wherein the epitaxial layer of silicon carbide comprises an epitaxial layer of silicon carbide having a thickness of from about 0.05 µm to about 1 µm.

23. A silicon carbide device according to claim 22, wherein the epitaxial layer of silicon carbide comprises an epitaxial layer of silicon carbide having a thickness of from about 1000 to about 5000 Å.

24. A silicon carbide device according to claim 21, wherein the epitaxial layer comprises n-type silicon carbide having a sheet charge of less than about $10^{13}$ cm$^{-2}$.

25. A silicon carbide device according to claim 21, wherein the second regions of n-type silicon carbide have a sheet charge of less than about $10^{13}$ cm$^{-2}$.

26. A silicon carbide device according to claim 25, wherein the second regions of n-type silicon carbide have a depth of from about 0.05 µm to about 1 µm.

27. A silicon carbide device according to claim 21, wherein an interface state density of an interface between the oxide layer and the epitaxial layer, the first regions of n-type silicon carbide and the second regions of n-type silicon carbide is less than about $10^{12}$ eV$^{-1}$cm$^{-2}$ between about 0.3 and about 0.4 eV of the conduction band energy of 4H polytype silicon carbide.

28. A silicon carbide device according to claim 21, further comprising second regions of p-type silicon carbide disposed in respective ones of the first regions of p-type silicon carbide, wherein the second regions of p-type silicon carbide have a carrier concentration greater than the carrier concentration of the first regions of silicon carbide, the second regions of silicon carbide being adjacent the first regions of n-type silicon carbide and opposite the second regions of n-type silicon carbide.

29. A silicon carbide device according to claim 28, further comprising:

windows in the epitaxial layer positioned to expose the second regions of p-type silicon carbide; and first source contacts within the window on the second regions of p-type silicon carbide and on the first regions of n-type silicon carbide.

30. A silicon carbide device according to claim 21, further comprising a gate contact on the oxide layer.

31. A silicon carbide device according to claim 30, wherein the gate contact is p-type polysilicon.

32. A silicon carbide device according to claim 21, further comprising:

a layer of n-type silicon carbide having a carrier concentration greater than the carrier concentration of the drift layer and disposed adjacent the drift layer opposite the oxide layer; and a drain contact on the layer of n-type silicon carbide.

33. A silicon carbide device comprising:

a drift layer of n-type silicon carbide;

first regions of p-type silicon carbide in the drift layer, the first regions of p-type silicon carbide being spaced apart and having peripheral edges which define a region of the drift layer therebetween;

first regions of n-type silicon carbide having a carrier concentration greater than a carrier concentration of the drift layer in the first regions of p-type silicon carbide and spaced apart from the peripheral edges of the first regions of p-type silicon carbide;

second regions of n-type silicon carbide having a carrier concentration less than the carrier concentration of the first regions of n-type silicon carbide and which extend from the first regions of n-type silicon carbide to the peripheral edges of the first regions of p-type silicon carbide;

a nitrided oxide layer on the drift layer, the first regions of n-type silicon carbide and the second regions of n-type silicon carbide; and wherein the second regions of n-type silicon carbide extend a distance of from about 0.5 µm to about 5 µm from the first regions of n-type silicon carbide to the peripheries of the first regions of p-type silicon carbide.

34. A silicon carbide device, comprising:

a drift layer of n-type silicon carbide;

first regions of p-type silicon carbide in the drift layer, the first regions of p-type silicon carbide being spaced apart and having peripheral edges which define a region of the drift layer therebetween;

first regions of n-type silicon carbide having a carrier concentration greater than a carrier concentration of the drift layer in the first regions of p-type silicon carbide and spaced apart from the peripheral edges of the first regions of p-type silicon carbide;

second regions of n-type silicon carbide having a carrier concentration less than the carrier concentration of the first regions of n-type silicon carbide and which extend from the first regions of n-type silicon carbide to the peripheral edges of the first regions of p-type silicon carbide;

a nitrided oxide layer on the drift layer, the first regions of n-type silicon carbide and the second regions of n-type silicon carbide; and wherein the first regions of p-type silicon carbide are spaced apart by a distance of from about 1 µm to about 10 µm.

35. A silicon carbide device according to claim 34, wherein the first regions of p-type silicon carbide have a carrier concentration of from about $1 \times 10^{16}$ to about $2 \times 10^{19}$ cm$^{-3}$.

36. A silicon carbide device, comprising:

a drift layer of n-type silicon carbide;

first regions of p-type silicon carbide in the drift layer, the first regions of p-type silicon carbide being spaced apart and having peripheral edges which define a region of the drift layer therebetween;

first regions of n-type silicon carbide having a carrier concentration greater than a carrier concentration of the drift layer in the first regions of p-type silicon carbide and spaced apart from the peripheral edges of the first regions of p-type silicon carbide;

second regions of n-type silicon carbide having a carrier concentration less than the carrier concentration of the first regions of n-type silicon carbide and which extend from the first regions of n-type silicon carbide to the peripheral edges of the first regions of p-type silicon carbide;

a nitrided oxide layer on the drift layer, the first regions of n-type silicon carbide and the second regions of n-type silicon carbide;

an epitaxial layer of silicon carbide on the first p-type regions and the drift layer of n-type silicon carbide, wherein the second regions of n-type silicon carbide extend into the epitaxial layer, the first regions of n-type silicon carbide extend through the epitaxial layer and the oxide layer is on the epitaxial layer, the first regions of n-type silicon carbide and the second regions of n-type silicon carbide; and wherein the epitaxial layer comprises undoped silicon carbide.

37. A silicon carbide device, comprising:

a drift layer of n-type silicon carbide;

first regions of p-type silicon carbide in the drift layer, the first regions of p-type silicon carbide being spaced apart and having peripheral edges which define a region of the drift layer therebetween;

first regions of n-type silicon carbide having a carrier concentration greater than a carrier concentration of the drift layer in the first regions of p-type silicon carbide and spaced apart from the peripheral edges of the first regions of p-type silicon carbide;

second regions of n-type silicon carbide having a carrier concentration less than the carrier concentration of the first regions of n-type silicon carbide and which extend from the first regions of n-type silicon carbide to the peripheral edges of the first regions of p-type silicon carbide;

a nitrided oxide layer on the drift layer, the first regions of n-type silicon carbide and the second regions of n-type silicon carbide;

an epitaxial layer of silicon carbide on the first p-type regions and the drift layer of n-type silicon carbide, wherein the second regions of n-type silicon carbide extend into the epitaxial layer, the first regions of n-type silicon carbide extend through the epitaxial layer and the oxide layer is on the epitaxial layer, the first regions of n-type silicon carbide and the second regions of n-type silicon carbide; and wherein the second regions of n-type silicon carbide extend a distance of from about 0.5 µm to about 5 µm from the first regions of n-type silicon carbide to the peripheries of the first regions of p-type silicon carbide.

38. A silicon carbide device, comprising:

a drift layer of n-type silicon carbide;

first regions of p-type silicon carbide in the drift layer, the first regions of p-type silicon carbide being spaced apart and having peripheral edges which define a region of the drift layer therebetween;

first regions of n-type silicon carbide having a carrier concentration greater than a carrier concentration of the drift layer in the first regions of p-type silicon carbide and spaced apart from the peripheral edges of the first regions of p-type silicon carbide;

second regions of n-type silicon carbide having a carrier concentration less than the carrier concentration of the first regions of n-type silicon carbide and which extend from the first regions of n-type silicon carbide to the peripheral edges of the first regions of p-type silicon carbide;

a nitrided oxide layer on the drift layer, the first regions of n-type silicon carbide and the second regions of n-type silicon carbide;

an epitaxial layer of silicon carbide on the first p-type regions and the drift layer of n-type silicon carbide, wherein the second regions of n-type silicon carbide extend into the epitaxial layer, the first regions of n-type silicon carbide extend through the epitaxial layer and the oxide layer is on the epitaxial layer, the first regions of n-type silicon carbide and the second regions of n-type silicon carbide; and wherein the first regions of p-type silicon carbide are spaced apart by a distance of from about 1 µm to about 10 µm.

39. A silicon carbide device according to claim 38, wherein the first regions of p-type silicon carbide have a carrier concentration of from about $1 \times 10^{16}$ to about $2 \times 10^{19}$ cm$^{-3}$.

40. A silicon carbide metal-oxide semiconductor field effect transistor, comprising:

a silicon carbide MOSFET, having an n-type silicon carbide drift layer, spaced apart p-type silicon carbide regions in the n-type silicon carbide drift layer and having n-type silicon carbide regions therein, and a nitrided oxide layer on the n-type silicon carbide drift layer;

a region between the n-type silicon carbide regions and the drift layer and is adjacent the nitrided oxide layer that is configured to self deplete upon application of a zero gate bias; and wherein the region that is configured to self-deplete extends to but not into the n-type silicon carbide drift layer and has a higher n-type dopant concentration than is present in an n-type silicon carbide region adjacent the region that is configured to self deplete.

41. A silicon carbide metal-oxide semiconductor field effect transistor according to claim 40, wherein the p-type silicon carbide regions comprise spaced apart regions of silicon carbide having aluminum implanted therein.

42. A silicon carbide metal-oxide semiconductor field effect transistor according to claim 40, wherein the region that is configured to self-deplete comprises a region of silicon carbide having a sheet charge corresponding to a sheet charge of an epitaxial layer of silicon carbide having a thickness of about 3500 Å and carrier concentration of about $2\times10^{16}$ cm$^{-3}$.

43. A silicon carbide metal-oxide semiconductor field effect transistor according to claim 40, further comprising a gate contact on the oxide layer, the gate contact comprising p-type polysilicon.

44. A silicon carbide metal-oxide field effect transistor according to claim 40, wherein the silicon carbide comprises 4H polytype silicon carbide and wherein an interface between the oxide layer and the n-type drift layer has an interface state density of less than $10^{12}$ eV$^{-1}$cm$^{-2}$ for energy levels between about 0.3 and about 0.4 eV of a conduction band energy of 4H polytype silicon carbide.

* * * * *

UNITED STATES PATENT AND TRADEMARK OFFICE
CERTIFICATE OF CORRECTION

PATENT NO. : 6,956,238 B2
DATED : October 18, 2005
INVENTOR(S) : Ryu et al.

It is certified that error appears in the above-identified patent and that said Letters Patent is hereby corrected as shown below:

Title page,
Item [60], Related U.S. Application Data, add -- Application No. 09/834,283, filed on Apr. 12, 2001, now Pat. No. 6,610,366. --.
Item [56], References Cited, U.S. PATENT DOCUMENTS, add the following:

| | | | |
|---|---|---|---|
| -- 6,767,843 | 07/2004 | Lipkin et al. | 438/758 |
| 6,759,684 | 07/2004 | Fukuda et al. | 257/77 |
| 6,653,659 | 11/2003 | Ryu et al. | 257/77 |
| 6,551,865 | 04/2003 | Kumar et al. | 438/137 |
| 6,429,041 | 08/2002 | Ryu et al. | 438/105 |
| 6,303,508 | 10/2001 | Alok | 438/705 |
| 6,297,100 | 10/2001 | Kumar et al. | 438/268 |
| 6,180,958 | 01/2001 | Cooper, Jr. | 257/77 |
| 6,133,587 | 10/2000 | Takeuchi et al. | 257/77 |
| 6,025,233 | 02/2000 | Teresawa | 438/270 |
| 6,020,600 | 02/2000 | Miyajima et al. | 257/76 |
| 5,976,936 | 11/1999 | Miyajima et al. | 438/268 |
| 5,917,203 | 06/1999 | Bhatnagar et al. | 257/139 |
| 5,877,041 | 03/1999 | Fuller | 438/105 |
| 5,851,908 | 12/1998 | Harris et al. | 438/520 |
| 5,837,572 | 11/1998 | Gardner et al. | 438/199 |
| 5,814,859 | 09/1998 | Ghezzo et al. | 257/335 |
| 5,804,483 | 09/1998 | Harris | 438/268 |
| 5,734,180 | 03/1998 | Malhi | 257/77 |
| 5,710,059 | 01/1998 | Rottner | 437/151 |
| 5,629,531 | 05/1997 | Palmour | 257/77 |
| 5,510,281 | 04/1996 | Ghezzo et al. | 437/41 |
| 5,396,085 | 03/1995 | Baliga | 257/77 |
| 5,393,999 | 02/1995 | Malhi | 257/289 |
| 5,385,855 | 01/1995 | Brown et al. | 437/41 |
| 5,384,270 | 01/1995 | Ueno | 437/40 |
| 5,348,895 | 09/1994 | Smayling et al. | 437/54 |
| 5,270,554 | 12/1993 | Palmour | 257/77 |
| 5,111,253 | 05/1992 | Korman et al. | 257/341 |
| 4,811,065 | 03/1989 | Cogan | 257/328 |
| 3,629,011 | 12/1971 | Tohi et al. | 148/1.5 |
| 2004/0212011 | 10/2004 | Ryu | 257/335 |
| 2004/0211980 A1 | 10/2004 | Ryu | 257/200 |
| 2002/0030191 | 03/2002 | Das et al. | 257/77 |
| 2002/0047125 A1 | 04/2002 | Fukuda et al. | 257/77 |
| 2002/0102358 | 08/2002 | Das et al. | 472/377 --. |

UNITED STATES PATENT AND TRADEMARK OFFICE
CERTIFICATE OF CORRECTION

PATENT NO.    : 6,956,238 B2
DATED         : October 18, 2005
INVENTOR(S)   : Ryu et al.

It is certified that error appears in the above-identified patent and that said Letters Patent is hereby corrected as shown below:

Title page (cont'd),
FOREIGN PATENT DOCUMENTS, add the following:

| | | | |
|---|---|---|---|
| DE | 19832329 A1 | 02/1998 | |
| EP | 1 204 145 A2 | 08/2002 | |
| EP | 1 058 317 A2 | 12/2000 | |
| JP | 01117363 | 05/1989 | Abstract |
| JP | 03034466 | 02/1991 | Abstract |
| WO | 97/98754 | 03/1997 | |
| WO | 98/02916 | 01/1998 | |
| WO | 01/78134 A1 | 10/2001 | |

Under OTHER PUBLICATIONS
Baliga, Power Semiconductor Devices, Chapter 7, PWS Publishing, 1996
Bhatnagar et al. "Comparison of 6H-SiC, 3C-SiC, and Si for Power Devices," *IEEE Transactions on Electron Devices*, Vol. 40, No. 3, March 1993, pp. 645-55.
Chung et al., "The Effect of Si:C Source Ratio on $SiO_2$/SiC Interface State Density for Nitrogen Doped 4H and 6H-SiC," *Materials Science Forum.* (2000) Vols. 338-342, pp. 1097-1100.
Dahlquist et al. "A 2.8kV, Forward Drop JBS Diode with Low Leakage," *Materials Science Forum*, Vols. 338-342, (2000) pp. 1179-82.
Mondal et al. "An Integrated 500-V Power DSMOSFET/Antiparallel Rectifier Device with Improved Diode Reverse Recovery Characteristics," *IEEE Electron Device Letters*, Vol. 23, No. 9, September 2002, pp. 562-4.
Motorola Power MOSFET Transistor Databook, 4th edition. Motorola, INc., 1989, pp. 2-5-4 - 2-5-7.
Palmour et al. "SiC Device Technology: Remaining Issues," Diamond and Related Materials. vol. 6, 1997, pp. 1400-1404.
Rao et al. "P-N Junction Formation in 6H-SiC by Acceptor Implantation into N-Type Substrate," Nuclear Instruments and Methods in Physics Research B. vol. 106, 1995, pp. 333-338.
Rao et al. "Al and N Ion Implantations in 6H-SiC," Silicon Carbide and Related Materials. 1995 Conf, Kyoto, Japan. Published 1996.
Capano, M.A., et al., Ionization Energies and Electron Mobilities in Phosphorus—and Nitrogen-Implanted 4H-Silicon Carbide, IEEE ICSCRM Conference 1999, Research Triangle Park, North Carolina (Oct. 10-13, 1999).
Patel, R., et al., Phosphorus-Implanted High-Voltage N.sup.+ P 4H-SiC Junction Rectifiers, Proceedings of 1998 International Symposium on Poer Semiconductor Devices & ICs, pp. 387-390 (Kyoto).
Dastidar, Sujoyita, A Study of P-Type Activation in Silicon Carbide, Thesis (Purdue University, May 1998).

OTHER PUBLICATIONS,
"Lai et al.", reference, should read -- "Interface Properties of $N_2O$-Annealed --.

UNITED STATES PATENT AND TRADEMARK OFFICE
CERTIFICATE OF CORRECTION

PATENT NO. : 6,956,238 B2
DATED : October 18, 2005
INVENTOR(S) : Ryu et al.

It is certified that error appears in the above-identified patent and that said Letters Patent is hereby corrected as shown below:

Column 24,
Line 15, should read -- interface state density of less than $10^{12}eV^{-11}cm^{-2}$ for --.

Signed and Sealed this

Eighth Day of August, 2006

JON W. DUDAS
*Director of the United States Patent and Trademark Office*